(12) United States Patent
Goh et al.

(10) Patent No.: US 8,933,435 B2
(45) Date of Patent: Jan. 13, 2015

(54) TUNNELING TRANSISTOR

(71) Applicants: National University of Singapore, Singapore (SG); GLOBALFOUNDRIES Singapore Pte. Ltd., Singapore (SG)

(72) Inventors: Kian Hui Goh, Singapore (SG); Eng Huat Toh, Singapore (SG); Yee Chia Yeo, Singapore (SG)

(73) Assignees: GLOBALFOUNDRIES Singapore Pte. Ltd. (SG); National University of Singapore (SG)

( * ) Notice: Subject to any disclaimer, the term of this patent is extended or adjusted under 35 U.S.C. 154(b) by 43 days.

(21) Appl. No.: 13/727,547

(22) Filed: Dec. 26, 2012

(65) Prior Publication Data
US 2014/0175381 A1      Jun. 26, 2014

(51) Int. Cl.
*H01L 29/06* (2006.01)
*H01L 29/78* (2006.01)
*H01L 29/66* (2006.01)

(52) U.S. Cl.
CPC ...... *H01L 29/7851* (2013.01); *H01L 29/66545* (2013.01)
USPC .......................................................... 257/39

(58) Field of Classification Search
USPC .......................................................... 257/39
See application file for complete search history.

(56) References Cited

U.S. PATENT DOCUMENTS

| | | | |
|---|---|---|---|
| 8,247,871 B2 * | 8/2012 | Mouli | 257/347 |
| 2010/0013013 A1 * | 1/2010 | Mouli | 257/347 |
| 2010/0164530 A1 * | 7/2010 | Hoentschel et al. | 324/765 |
| 2010/0252799 A1 * | 10/2010 | Kakoschke et al. | 257/5 |
| 2012/0306002 A1 * | 12/2012 | Yeh et al. | 257/327 |
| 2013/0075818 A1 * | 3/2013 | Lee et al. | 257/347 |
| 2013/0126985 A1 * | 5/2013 | Cheng et al. | 257/411 |

OTHER PUBLICATIONS

E. O. Kane, Zener Tunneling in Semiconductors, Journal of Physics and Chemistry of Solids, 1959, pp. 181-188, vol. 12, Great Britain.

* cited by examiner

*Primary Examiner* — Thao P Le
(74) *Attorney, Agent, or Firm* — Horizon IP Pte. Ltd.

(57) ABSTRACT

Devices and methods for forming a device are presented. The device includes a substrate and a fin type transistor disposed on the substrate. The transistor includes a fin structure which serves as a body of the transistor. The fin structure includes first and second end regions and an intermediate region in between the first and second end regions. A source region is disposed on the first end region, a drain region disposed in the second end region and a gate disposed on the intermediate region of the fin structure. The device includes a channel region disposed adjacent to the source region and a gate dielectric of the gate. A source tunneling junction is aligned to the gate with a controlled channel thickness $T_{CH}$.

20 Claims, 22 Drawing Sheets

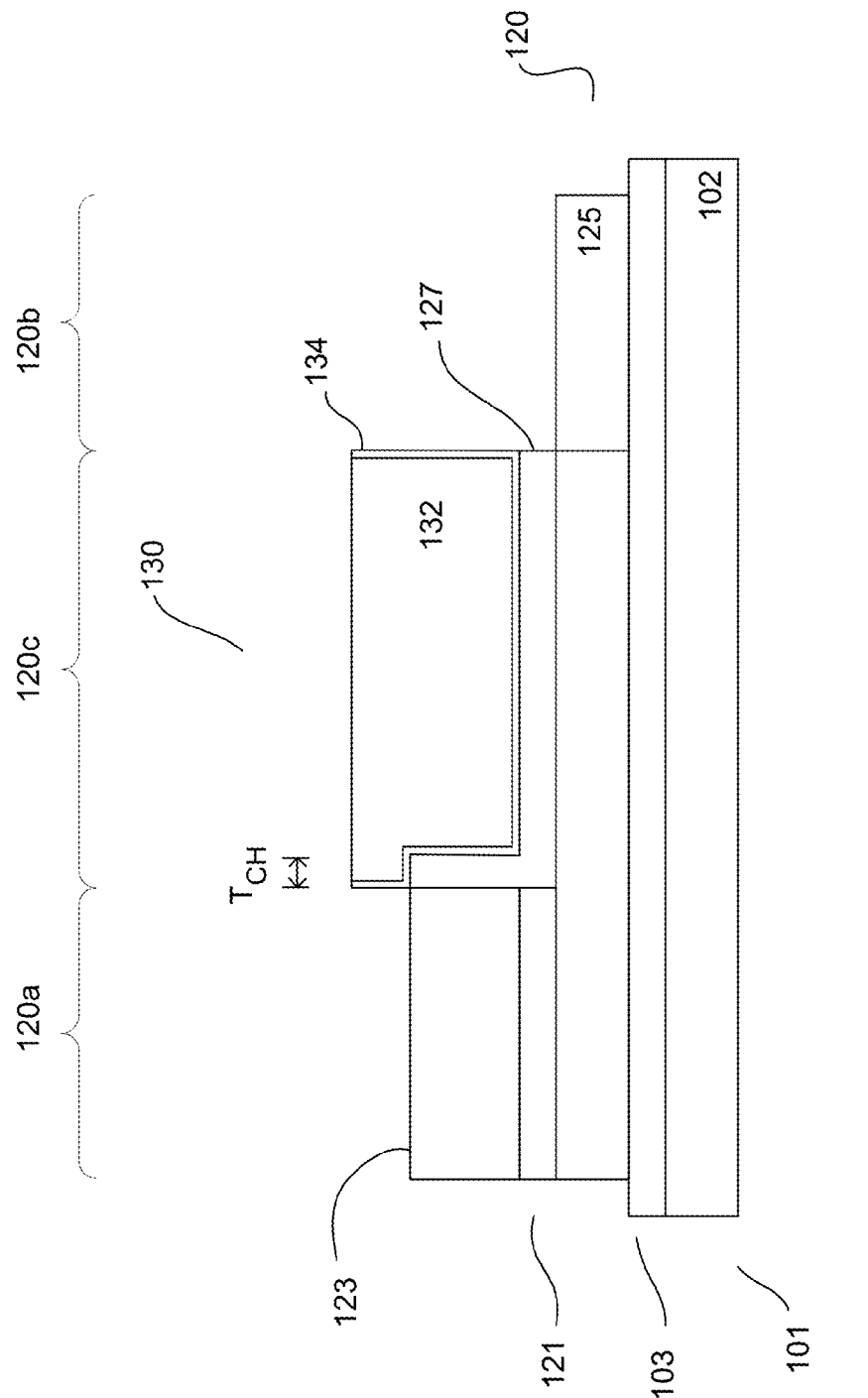

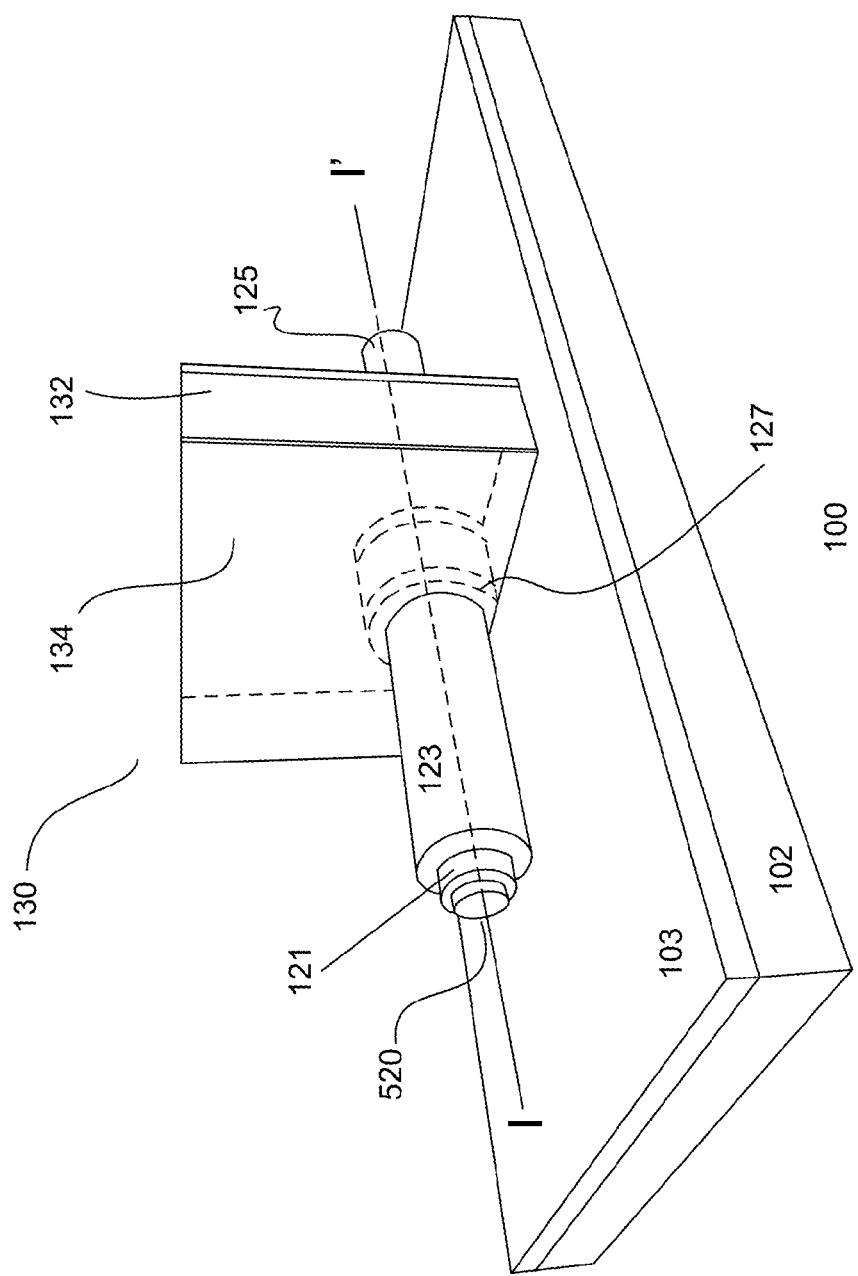

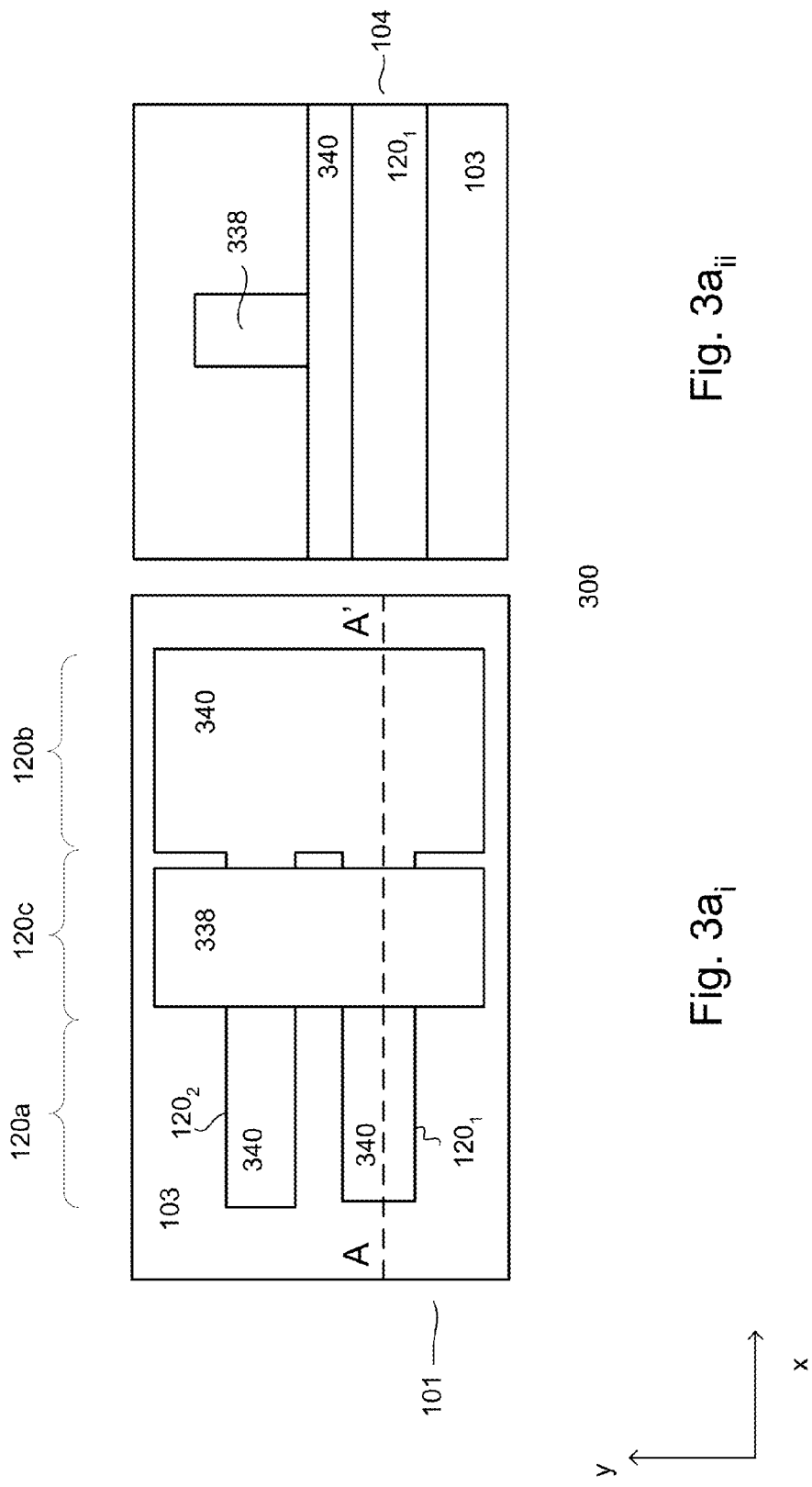

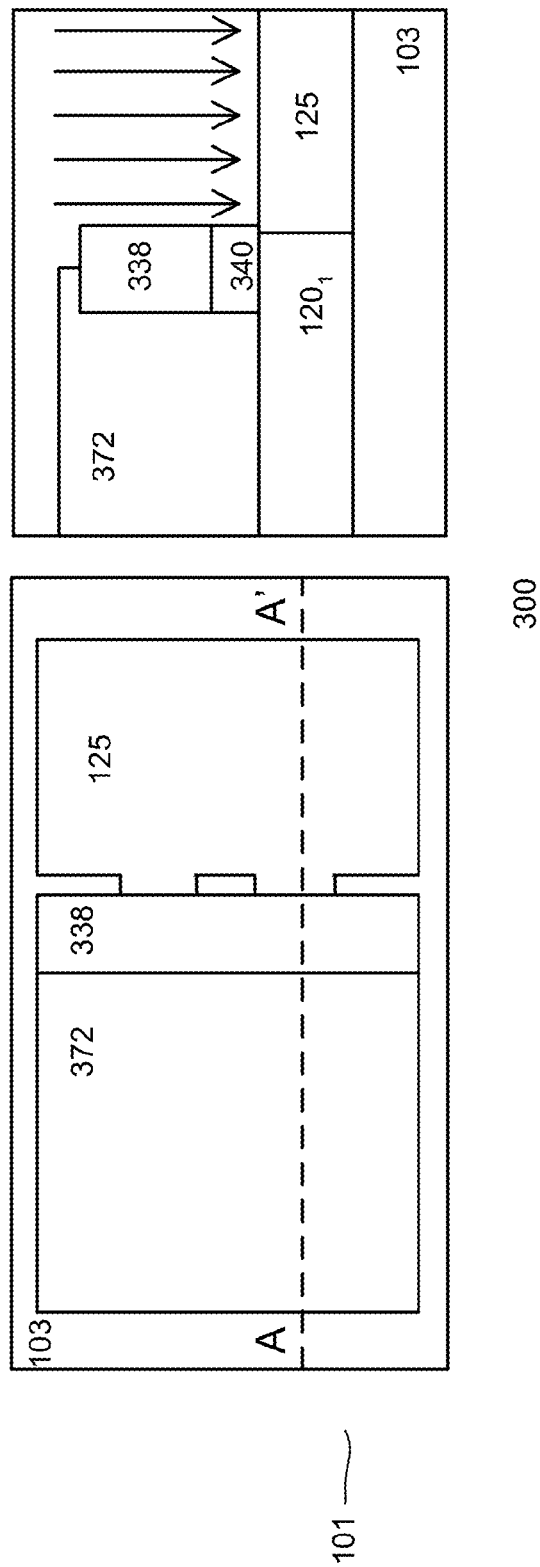

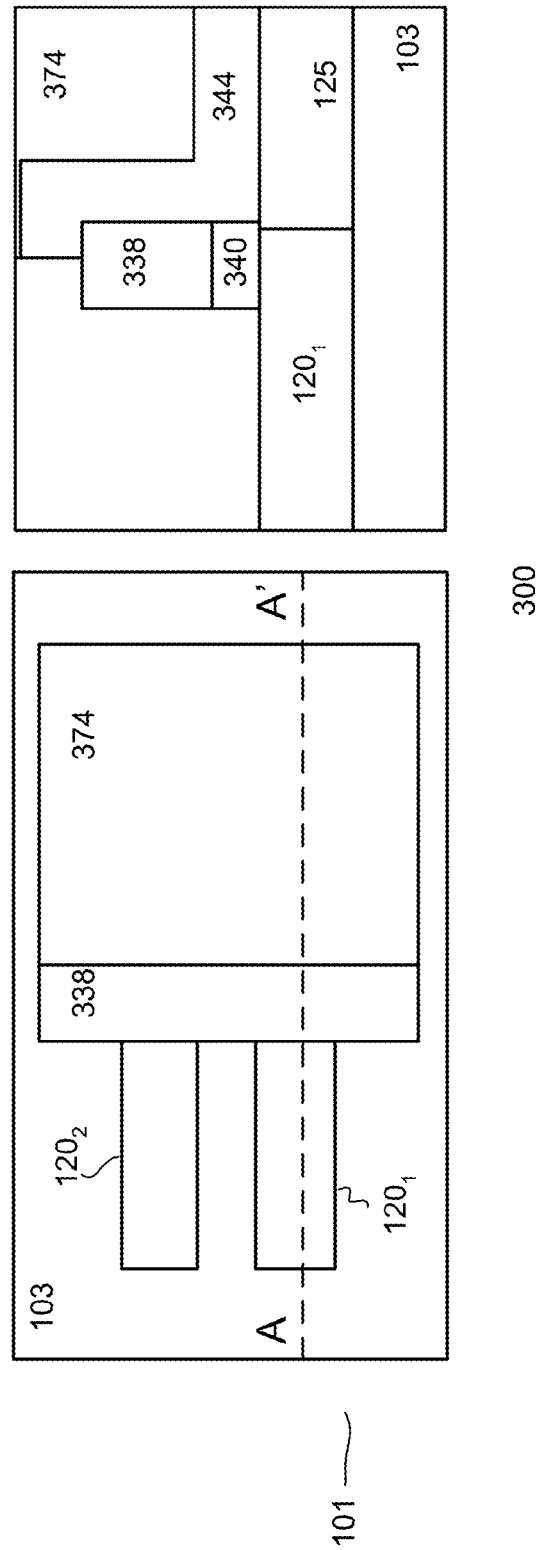
Fig. 3c_ii
Fig. 3c_i

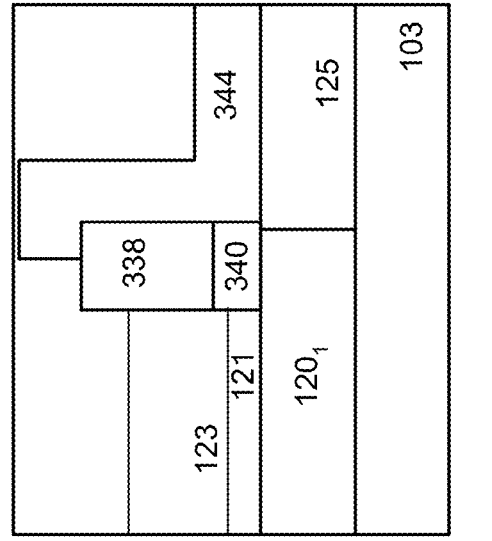
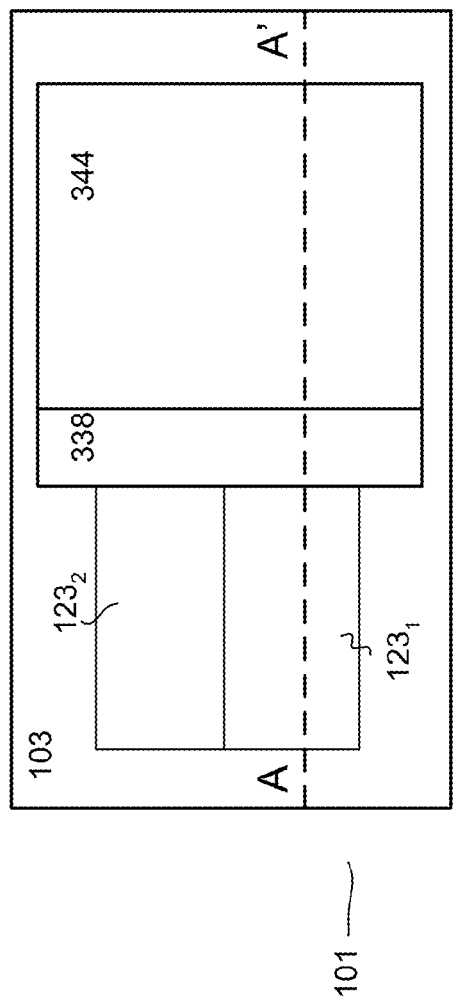
Fig. 3d_i
Fig. 3d_ii

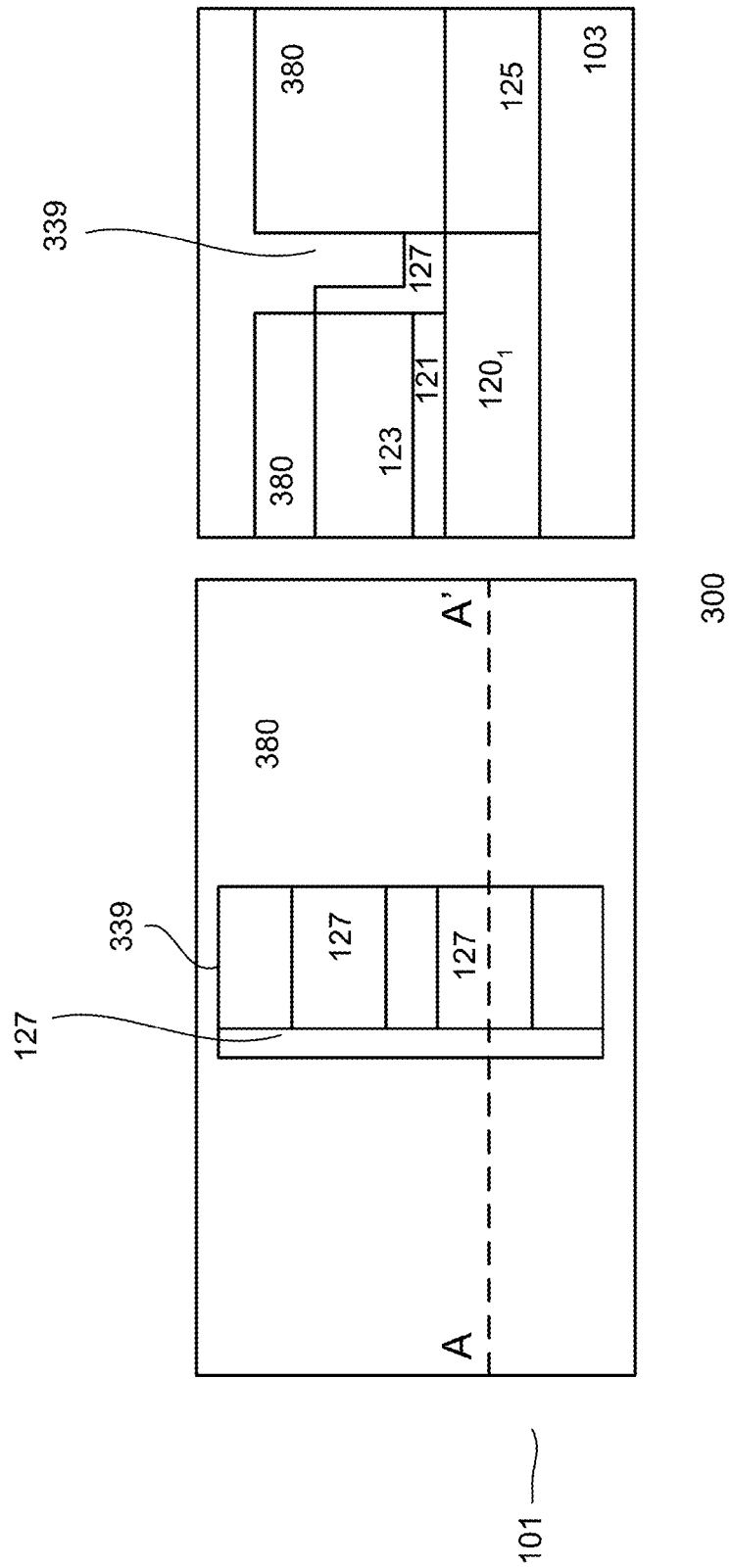

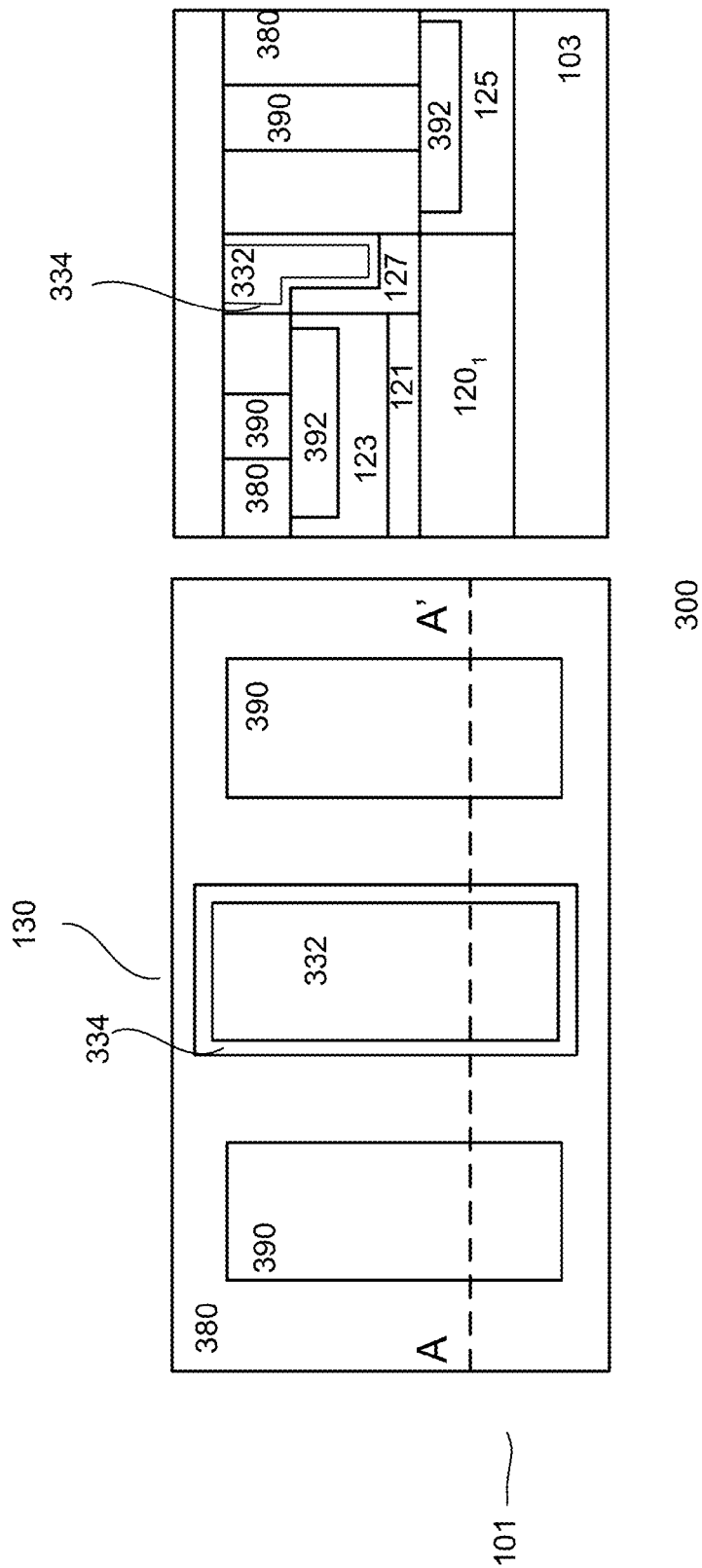
Fig. 3f_ii
Fig. 3f_i

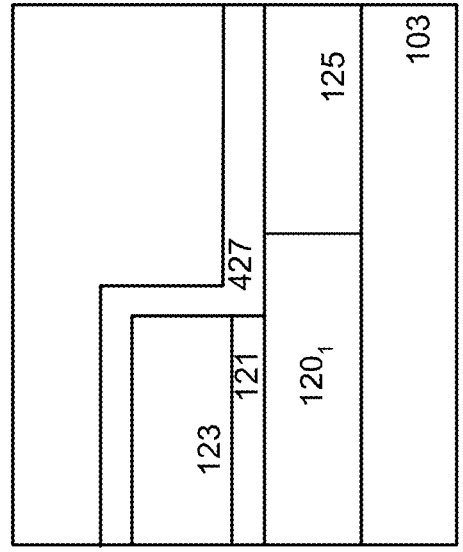
Fig. 4a_{ii}
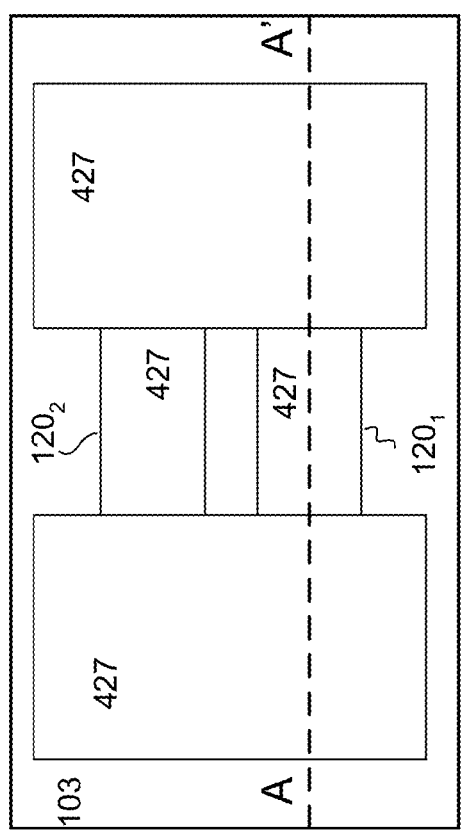
Fig. 4a_i

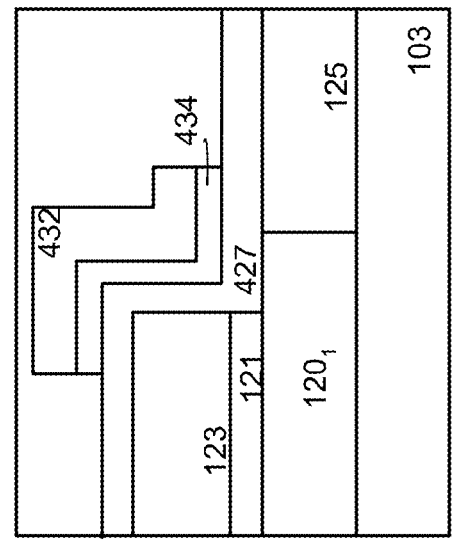
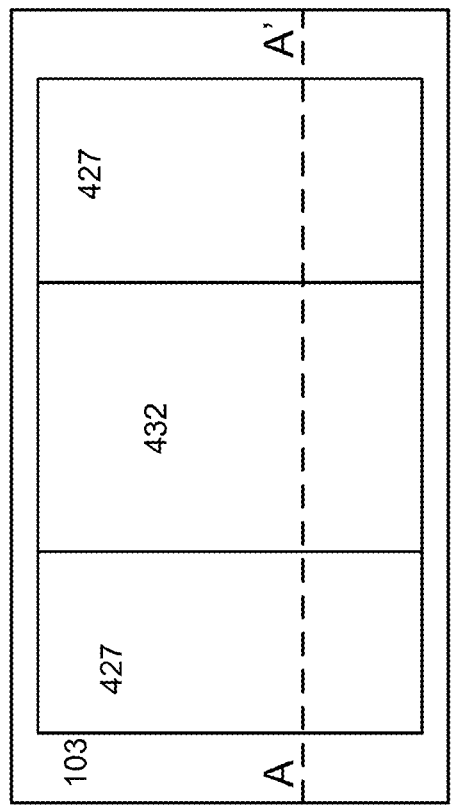
Fig. 4b_i
Fig. 4b_ii

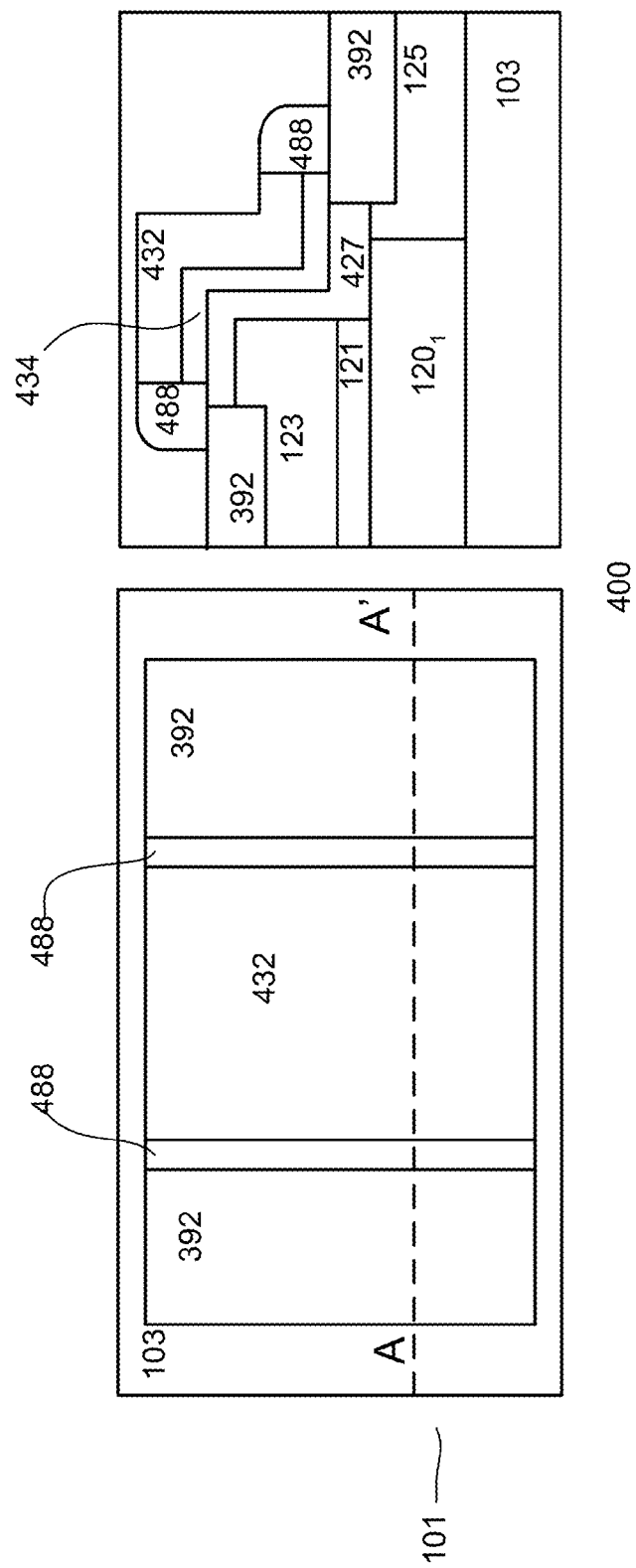
Fig. 4c$_i$         Fig. 4c$_{ii}$

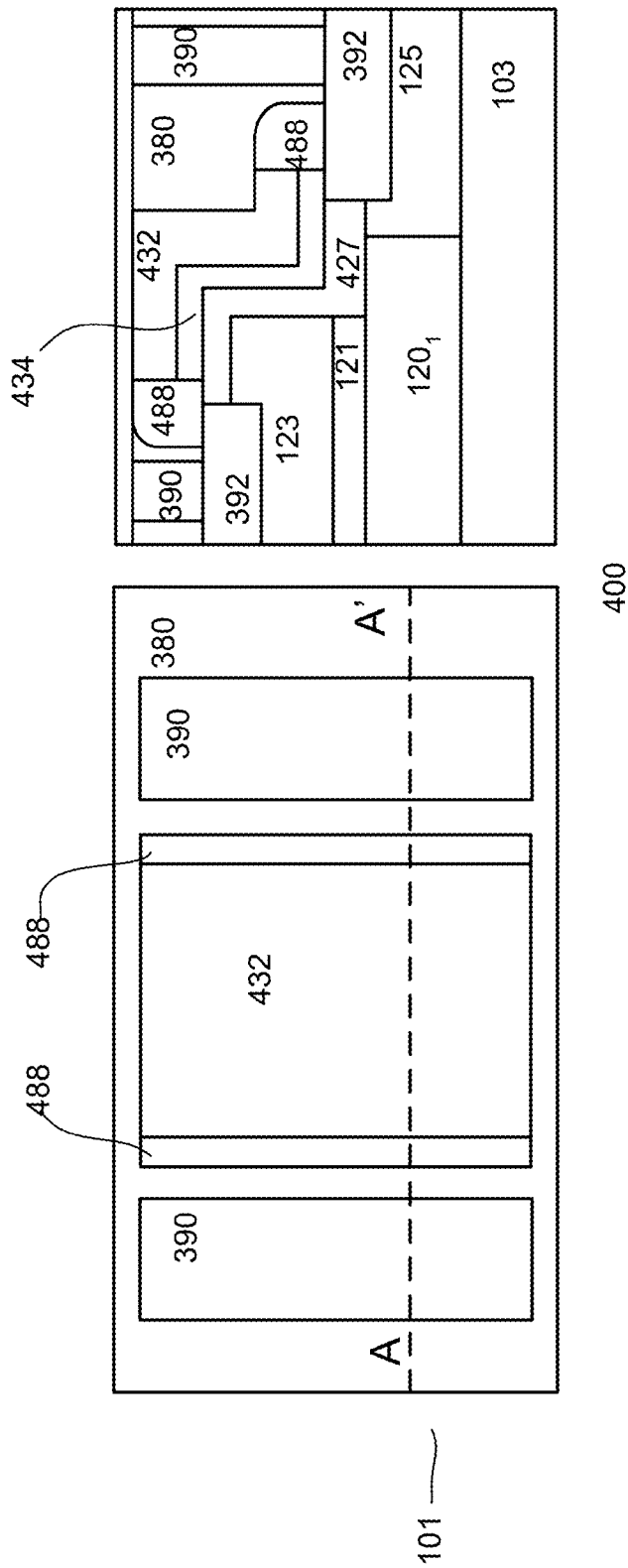

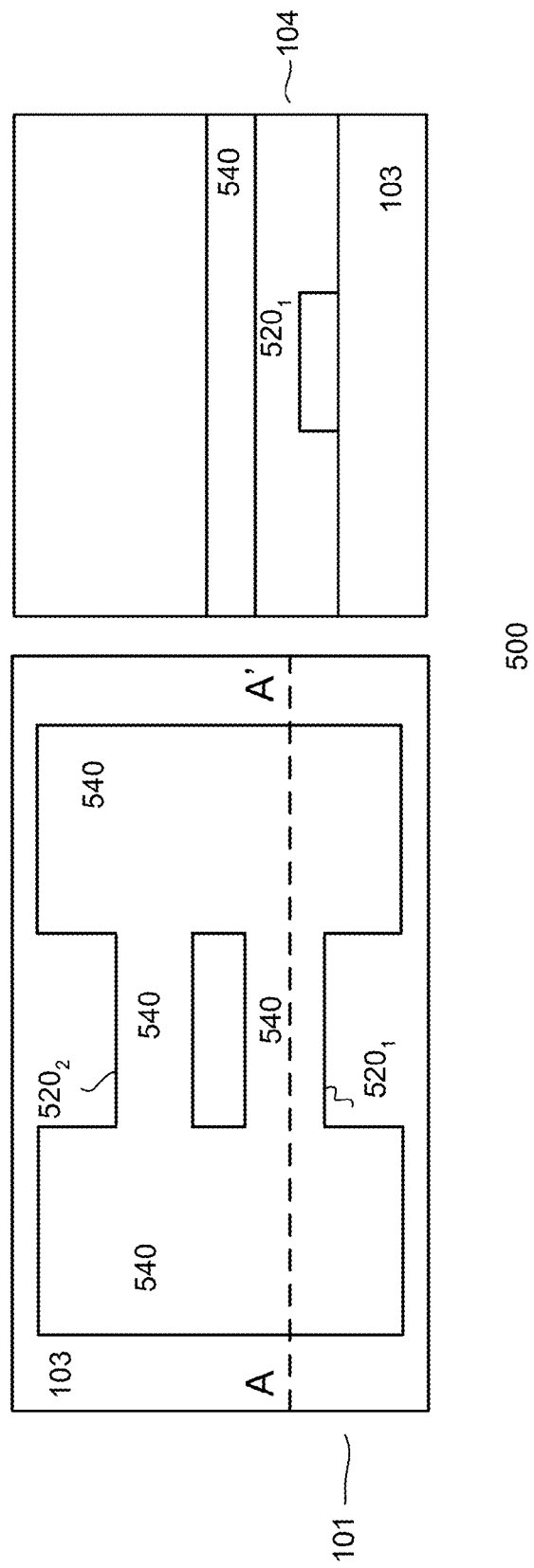

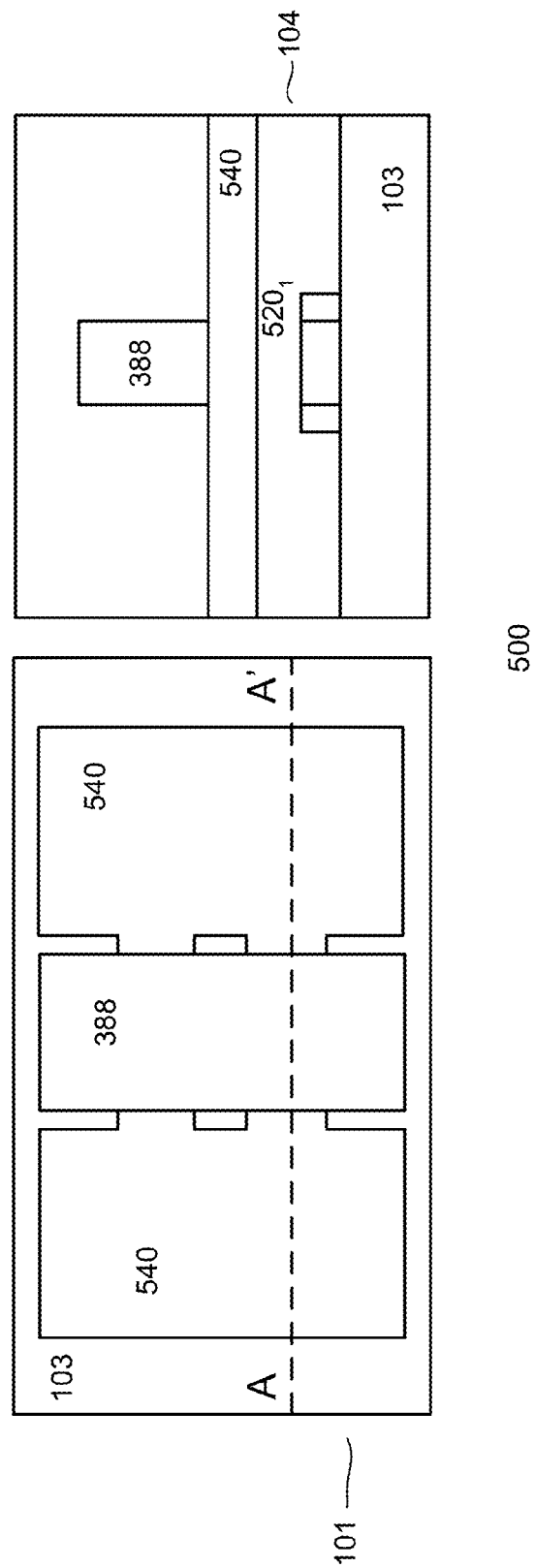
Fig. 5b$_i$
Fig. 5b$_{ii}$

TUNNELING TRANSISTOR

BACKGROUND

Conventional CMOS devices have difficulty in maintaining high drive current ($I_{ON}$) with low leakage ($I_{OFF}$) when semiconductor device feature size continues to shrink to nanometer regime and approaches the scaling limits for CMOS processes and technology. Moreover, it is also difficult to scale the subthreshold swing (SS), which placed a limit on both the power supply voltage and threshold voltage scaling at such reduced feature size.

Therefore, it is desirable to provide a highly scalable device with increased or enhanced $I_{ON}$ and at the same time with low SS.

SUMMARY

Embodiments generally relate to semiconductor device. In one embodiment, a device is presented. The device includes a substrate and a fin type transistor disposed on the substrate. The transistor includes a fin structure which serves as a body of the transistor. The fin structure includes first and second end regions and an intermediate region in between the first and second end regions. A source region is disposed on the first end region, a drain region disposed in the second end region and a gate disposed on the intermediate region of the fin structure. The device includes a channel region disposed adjacent to the source region and a gate dielectric of the gate. A source tunneling junction is aligned to the gate with a controlled channel thickness $T_{CH}$.

In another embodiment, a method for forming a device is disclosed. The method includes providing a substrate and forming a fin-type transistor on the substrate. A fin structure having a shape is formed. The fin structure includes first and second end regions and an intermediate region in between the first and second end regions and serves as a body of the transistor. A source region is formed on the first end region, a drain region is formed in the second end region and a gate is formed on the intermediate region of the fin structure. The method further includes forming a channel region adjacent to the source region and a gate dielectric of the gate. A source tunneling junction is aligned to the gate with a controlled channel thickness $T_{CH}$.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following:

FIGS. 1a-c show various views of an embodiment of a device;

FIG. 1e shows another embodiment of a device;

FIGS. 3a-f show an embodiment of a process for forming a device;

FIGS. 4a-d show another embodiment of a process for forming a device;

FIGS. 5a-b show another embodiment of a process for forming a device;

DETAILED DESCRIPTION

Embodiments generally relate to devices, such as semiconductor devices or ICs. More particularly, some embodiments relate to transistors employed to form ICs. The transistors, for example, include vertical tunneling FinFET transistors. The ICs can be any type of IC. For example, the IC may be a dynamic or static random access memory, a signal processor, or a system on chip (SoC) device. The ICs can be incorporated into, for example, consumer electronic products, such as computers, cell phones, and personal digital assistants (PDAs). Other types of devices or products are also useful.

Figure 1A:
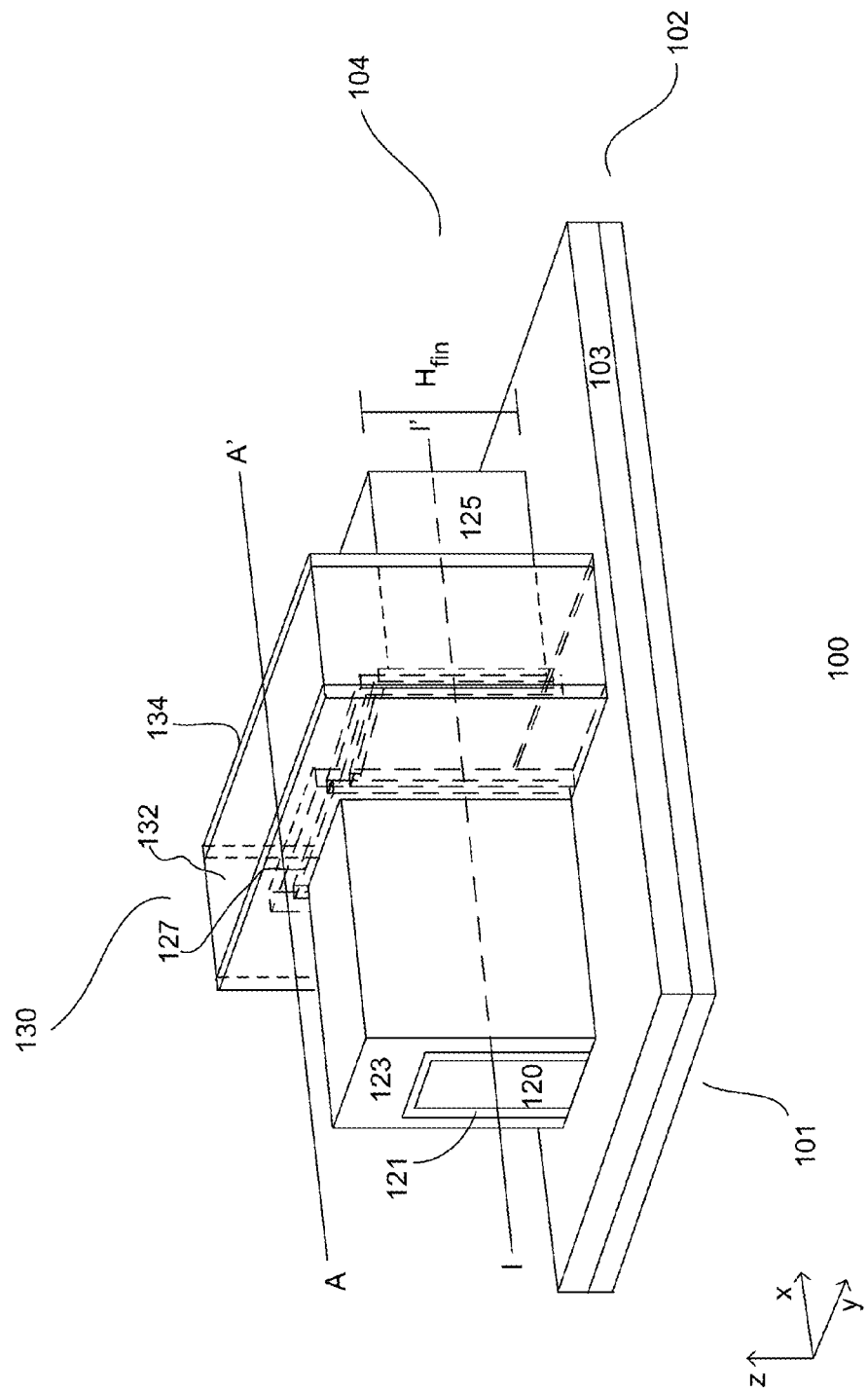
Figure 1B:
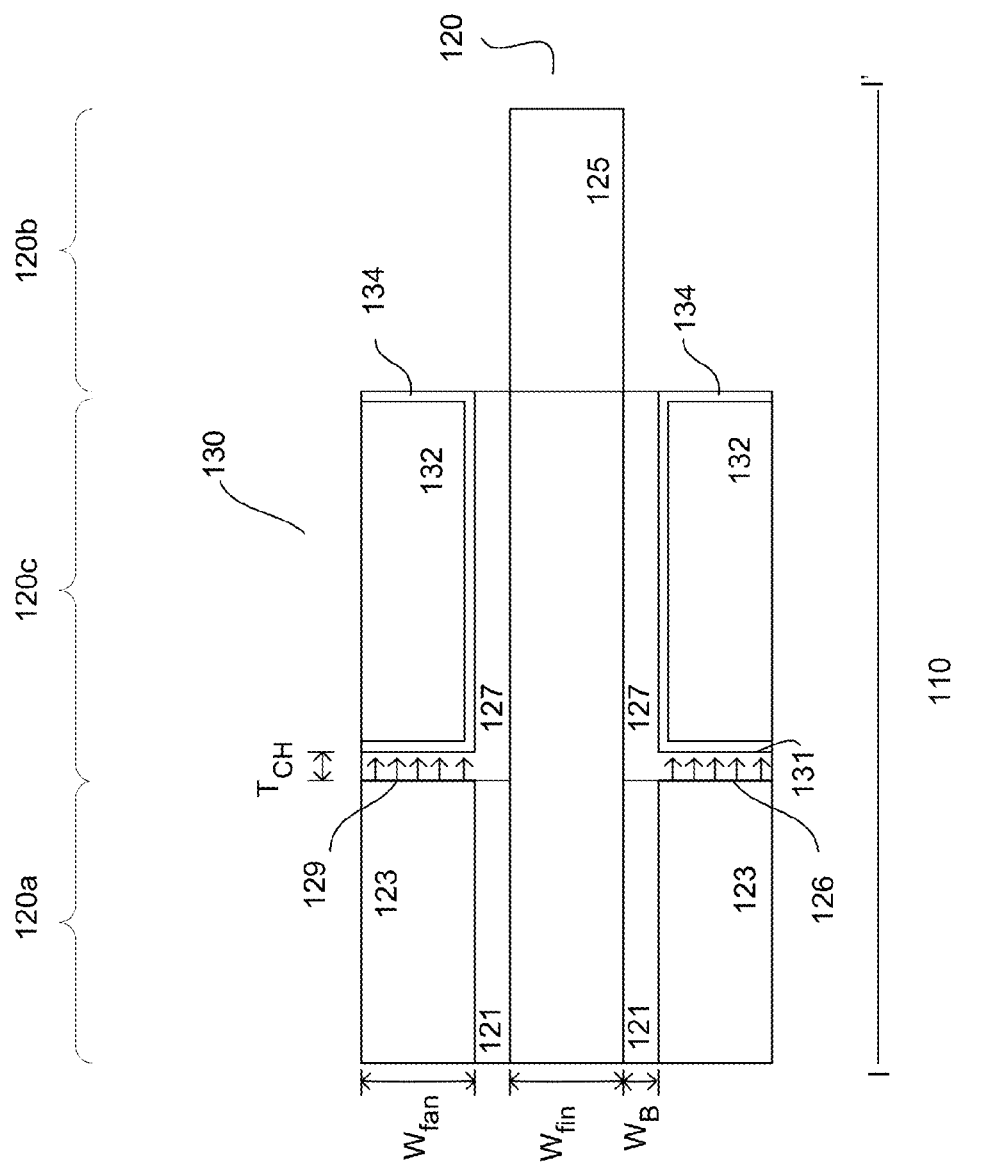

FIGS. 1a-c show various views of an embodiment of a device 100. FIG. 1a shows a 3-dimensional view of an embodiment of the device, FIG. 1b shows a corresponding cross-sectional view of the device along a x-y plane parallel to the substrate surface at I-I' while FIG. 1c shows a corresponding cross-sectional view of the device along a z-x plane perpendicular to the substrate surface at A-A'. As for FIG. 1d, it shows cross-sectional view of another embodiment of a device along the z-x plane at A-A'. The device, for example, is an IC. Other types of devices may also be useful. A substrate 101 is provided. The substrate serves as a base for the device.

As shown, the substrate is a crystalline-on-insulator (COI) substrate. A COI substrate includes a crystalline surface layer 104 separated from a crystalline bulk 102 by an insulator layer 103. The insulator layer, for example, may be a dielectric insulating material. The insulator layer, for example, is formed from silicon oxide, providing a buried oxide (BOX) layer. Other types of dielectric insulating materials may also be useful. The COI substrate may be a silicon-on-insulator (SOI) substrate. For example, the surface and bulk crystalline layers are single crystalline silicon. Other types of COI substrates, such as silicon-germanium (SiGe), germanium (Ge), gallium-arsenic (GaAs) or any other suitable semiconductor materials may also be useful. It is understood that the surface and bulk layers need not be the same material.

In other embodiments, the substrate may be a bulk semiconductor substrate. For example, the bulk substrate is a non-COI type of substrate. The bulk substrate may be a silicon substrate. Other types of semiconductor substrates may useful. The substrate may be an undoped or intrinsically doped substrate. The substrate may be a lightly doped substrate. In one embodiment, the substrate is lightly doped with p-type dopants. In the case of a COI substrate, at least the surface layer is lightly doped with p-type dopants. In other embodiments, the substrate may be lightly doped with other types of dopants, such as n-type dopants.

The substrate is prepared with a device region for a transistor 110. The transistor, in one embodiment, is a fin type transistor. For example, the transistor is a fin field effect transistor (FinFET). The FinFET is a tunneling FinFET. The tunneling FinFET, in one embodiment, is a vertical tunneling FinFET. Other types of fin transistors may also be useful. In one embodiment, the FinFET includes a fin 120 disposed on the substrate. In other embodiments, the FinFET includes a plurality of fins.

In one embodiment, the fin is an elongated structure. For example, the fin is an elongated member with a rectangular cross-sectional shape, forming a rectangular block. Providing other types of fins may also be useful. The fin may be provided by patterning the surface crystalline layer of the COI substrate. The thickness of the surface layer may define a height of the fin. The fin is disposed on the dielectric layer. For example, the fin is disposed on the BOX layer.

In other embodiments, the fin may be a nanowire 520. The nanowire, for example, may have circular cross-sectional shape as shown in FIG. 1e. Providing nanowire with other types of cross-sectional shapes, such as rectangular, square, elliptical or trapezoidal, may also be useful. The use of nanowire, such as vertically stacked nanowire, is advantageous as it increases the packing density and tunneling area.

In some embodiments, the fin is disposed on a bulk substrate. The dielectric layer is disposed on the surface of the bulk and covers a lower portion of the fin structure. For bulk substrates, the fin may be an integral part of the bulk substrate. For example, the fin is provided by patterning the substrate and forming the dielectric layer afterwards. Alternatively, the fin may be a semiconductor layer disposed on the bulk substrate. For example, the fin is an epitaxial semiconductor layer grown on the substrate surface. The fin may be formed by selective epitaxial growth (SEG) on the substrate using a patterned dielectric layer on the substrate surface.

The fin serves as the body of the transistor. The fin is disposed along a first direction. As shown, the fin is disposed along the x direction. The height of the fin structure ($H_{fin}$), for example, may be about 0.03-0.1 μm. Other fin heights may also be useful. The width of the fin structure ($W_{fin}$), for example, may be about 0.005-0.05 μm. The length of the fin structure ($L_{fin}$), for example, may be about 1-10 μm. Other dimensions for $H_{fin}$, $W_{fin}$ and $L_{fin}$ may also be useful. $H_{fin}$ and/or $W_{fin}$ may vary depending on the desired $I_{ON}$. For example, higher $I_{ON}$ may be achieved with higher $H_{fin}$. The dimensions of the fin structure, for example, may depend on device area scalability or design requirements.

The fin, for example, includes an intermediate region 120c disposed between first and second end regions 120a-b. The first end region serves as a source region, the intermediate region serves as a gate region while the second end region serves as a drain region.

A fin buffer layer 121 and a source layer 123 are provided in the source region of the fin. In one embodiment, the fin buffer layer is conformally disposed on the fin and the source is conformally disposed on the fin buffer layer. The fin buffer layer isolates the source layer from the fin. The source and fin buffer layers are crystalline semiconductor layers. For example, the fin buffer layer conformally surrounds the first end portion of the fin and the source layer conformally surrounds the fin buffer layer. The first end of fin is exposed to illustrate the different layers with the fin. However, it is understood that the first end of the fin may be covered by the fin buffer and source layers. In one embodiment, the fin buffer and source layers are epitaxial semiconductor layers.

The source and fin buffer layers may be formed from any element or combination of elements from group III-V of the periodic table. For example, the source and fin buffer layers may be Si, Ge, Ga-based, Al-based or alloys thereof. It is understood that the source and buffer layers may be of the same or different semiconductor materials.

In one embodiment, the fin buffer is an undoped or intrinsically doped layer. The source layer is a heavily doped layer. In one embodiment, the source layer is heavily doped with first polarity type dopants. In one embodiment, the first polarity type is p-type. For example, the source is a heavily p-doped epitaxial layer. The dopant concentration of the source, for example, is about $1e20$ $cm^{-2}$. Providing a source with other dopant concentrations may also be useful. The source layer may be doped by in-situ doping. Providing other types of doped source layers, such as n-type doped source layer, may also be useful.

The width or thickness of the buffer layer ($W_B$), for example, may be about 0.015-0.06 μm. For example, $W_B$ is about 0.06 μm. The thickness of the buffer layer may vary depending on, for example, the linewidth of the fin structure. In one embodiment, the thickness of the buffer layer should be the same or thicker than the thickness of a gate channel layer so that the entire source tunneling junction is aligned to the gate. As for the source layer, it may have a width or thickness ($W_{fan}$), for example, of about 10-30 nm. For example, $W_{fan}$ is about 20 nm. Other dimensions for $W_{fan}$ may also be useful. In one embodiment, $W_{fan}$ may vary or may be adjustable depending on the desired tunneling area which affects the drive current ($I_{ON}$) of the FinFET. For example, higher $I_{ON}$ may be achieved with larger $W_{fan}$. As such, the source is displaced away from the fin and forms an inner edge 126 at the interface of the first end and intermediate regions of the fin.

The second end region of the fin includes a drain 125. In one embodiment, the drain is a heavily doped drain with second polarity type dopants. For example, the drain is a heavily doped n-type drain. In one embodiment, the drain is formed by doping the second end portion of the fin with second polarity type dopants. Doping the second end portion of the fin may be by ion implantation.

A gate channel layer 127 is disposed in the intermediate region of the fin. The gate channel layer surrounds the intermediate region of the fin. In one embodiment, the gate channel layer conformally surrounds the intermediate region of the fin and lines the inner edge of the source layer. In other embodiments, the gate channel layer conformally surrounds the intermediate region of the fin and extends into a portion of the first and second end regions of the fin. For example, the gate channel layer extends to line a portion of the source layer and drain. Other configurations of the gate channel layer may also be useful.

In one embodiment, the gate channel layer is a crystalline semiconductor layer. The gate channel layer, in one embodiment, is an epitaxial semiconductor layer. The gate channel layer may be formed from any element or combination of elements from group III-V of the periodic table. For example, the gate channel layer may be Si, Ge, Ga-based, Al-based or alloys thereof. It is understood that the gate channel layer may be of the same or different materials from the source or buffer layers. The gate channel layer has a thickness $T_{CH}$ which can be well controlled since the layer is an epitaxial layer. The thickness of the epitaxial layer can be tailored for band engineering. For example, $T_{CH}$ may be about 5 nm. Other thicknesses may also be useful. For example, the gate channel layer should have a suitable thickness so that the electric field across the channel layer will not be too high to cause channel breakdown and would not render the gate electrostatic control over the tunneling junction ineffective.

Table 1 illustrates exemplary combinations of types of semiconductor layers for source, gate channel and fin buffer layers. For example, for a given source layer, corresponding channel and buffer layer options are provided. A prefix "i-" indicates that the layer is an intrinsically doped layer.

TABLE 1

| Source | Channel | Buffer |
|--------|---------|--------|
| Si | Si | Si |
|  |  | Si: C |
| SiGe | Si | Si |
|  | SiGe | Si: C |
| Ge | Ge | Si |
|  | SiGe | Si: C |
|  | Si | AlAs |
|  | GaAs | GaAs |
|  | InGaAs | InGaAs |
| GaAsSb | InAsP | i-InAsP |
|  | InGaAs | i-InGaAs |
|  | InAlAs | i-InAlAs |
| InGaSb | InAsSb | i-InAsSb |
| AlGaSb | InAsSb | i-InAsSb |
| AlGaPSb | InAsP | i-InAsP |
|  | InGaAs | i-InGaAs |
|  | InAlAs | i-InAlAs |

Figure 1D:
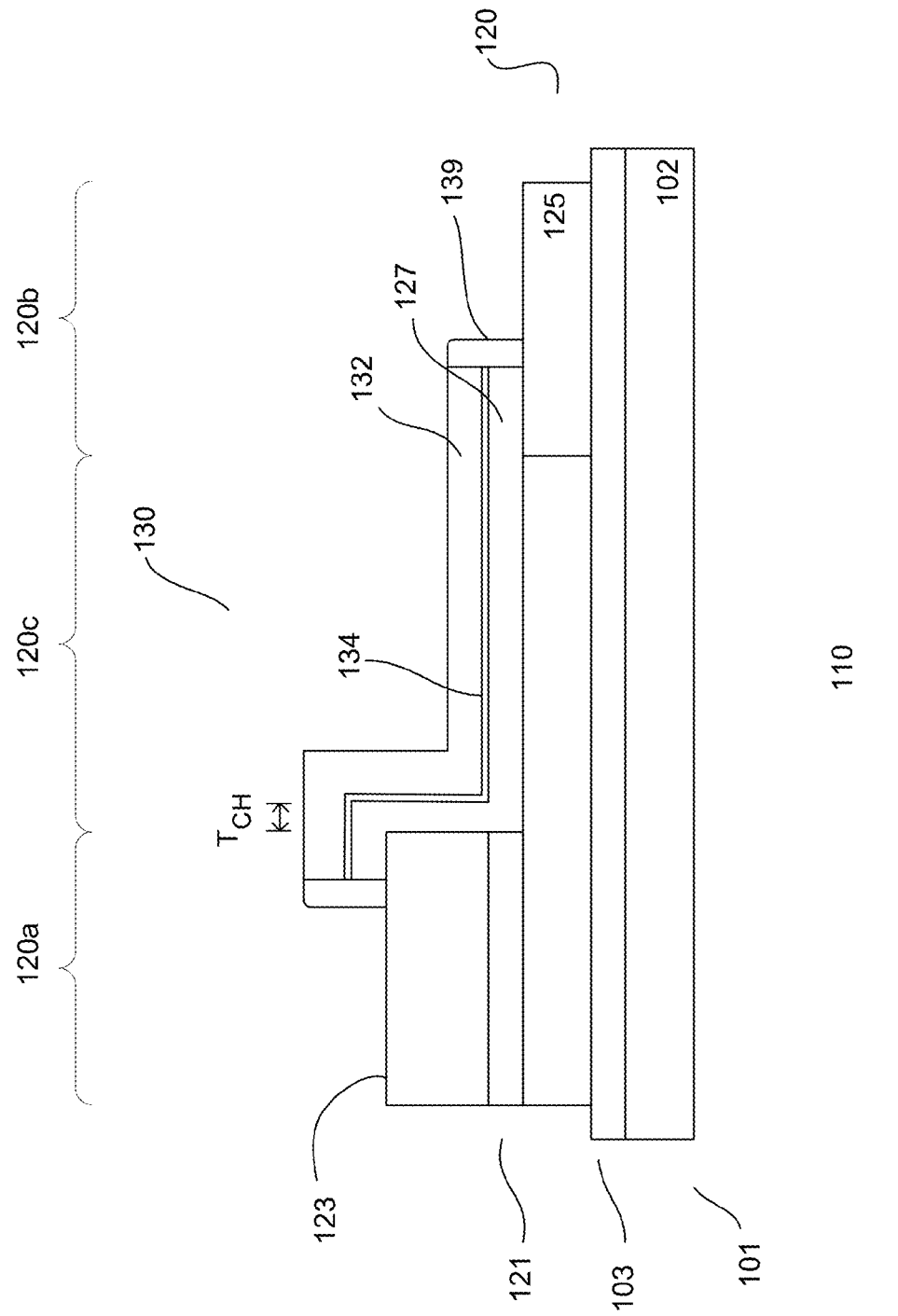
FIG. 1d shows a cross-sectional view of another embodiment of a device.

In one embodiment, a gate 130 is provided. As shown, the gate is disposed on the substrate and traverses the intermediate region of the fin. For example, the gate traverses both sides of the fin in a second direction. The second direction, for example, is along the y direction. In one embodiment, the first and second directions are orthogonal. Providing a gate which traverses the fin structure at other angles may also be useful. The gate has generally a polygonal cross-sectional shape. Adjacent sides of the polygon, for example, form 90° angles. In some embodiment, the gate may be a non-conformal structure, having a combination of polygonal cross-sectional shapes, depending on the underlying topography. For example, the gate may have a planar top surface while the lower surfaces depend on the underlying topography, as shown in FIG. 1c. In other embodiments, the gate may be conformal and the cross-sectional shape depends on the underlying topography, as shown in FIG. 1d. Providing gates with other cross-sectional shapes may also be useful.

The gate includes a gate electrode 132 and a gate dielectric layer 134. The gate dielectric layer is at least disposed between the gate electrode and gate channel layer. The gate dielectric layer is a conformal layer. The gate electrode may be a non-conformal layer. In other embodiments, the gate electrode is a conformal layer.

In one embodiment, the gate is a high k metal gate (HKMG). The HKMG includes a high k gate dielectric layer and a metal gate electrode. The dielectric layer, for example, may be silicon oxynitride, hafnium oxide, zirconium oxide or silicates thereof. Other types of high k dielectric materials may also be useful. As for the metal gate electrode, it may be W/TiNi, TaN, TiN, TaN/HfO$_2$ or Mo. Other types of gate electrode and gate dielectric materials may also be useful.

An inter-level dielectric (ILD) layer (not shown) may be disposed on the substrate covering the transistor. The ILD layer, for example, may be formed of SiO$_2$. Other types of dielectric materials may also be useful to form the ILD layer. The ILD layer, for example, may have a top surface which is coplanar with a top surface of the gate. Via Contacts may be provided in the ILD layers. The via contacts may be coupled to the source, drain and gate. Metal silicide contacts may be provided on the source and drain to reduce contact resistance.

As shown in FIG. 1d, dielectric spacers 139 may be provided on sidewalls of the gate. The dielectric spacers, for example, may include silicon nitride. Other types of dielectric materials may also be used. For example, the spacers may include silicon nitride or multiple layers of dielectric materials, such as silicon oxide and silicon nitride. The dielectric spacers facilitate in forming metal silicide contacts on the source and drain.

The tunneling transistor, as described, uses band-to-band tunneling (BTBT) effect to turn on and off. The gate voltage is used to adjust the bias between the P-N junction near the gate to achieve the purpose of turning on and off the tunneling transistor. When both the n dopant and p dopant concentrations between a P-N junction are very high, the band gap becomes small in the depletion region. Applying a reverse bias to the P-N junction decreases the band gap, increasing the tunnel current crossing the P-N junction. Furthermore, the tunneling is a vertical tunneling. For example, the tunneling occurs in the direction perpendicular to the channel/gate dielectric interface. The vertical tunneling FinFET as described results in advantages. As described, the source region is separated from the fin structure by the buffer layer, forming a raised or elevated source region. The elevated source region, for example, includes an in-situ doped epitaxial source layer for high dopant activation and provides an abrupt junction at the tunneling region. The abrupt junction at the tunneling region generates higher E-field with more band bending, thus increasing band-to-band tunneling which leads to further increase in $I_{ON}$.

Furthermore, the channel region includes an epitaxial layer which is epitaxially formed over the source region. As such, the source region is substantially aligned and in close proximity with the channel region. Moreover, the source region as described is spaced out from the fin structure by the buffer layer such that the channel layer which is epitaxially formed over the source region substantially aligns the source tunneling junction to the gate with the controlled channel thickness $T_{CH}$. The aligned source/channel interface 129 and the channel/gate dielectric interface 131 are parallel to each other. This allows for stronger and more uniform gate control for a more conformal perpendicular BTBT current under the gate. The conformal BTBT current under the gate minimizes the subthreshold swing (SS). The aligned source tunneling junction to the gate also increases the tunneling area, which is adjustable by scaling the width of the source region $W_{fan}$. Larger tunneling area also results in a further increase of $I_{ON}$.

In addition, the buffer, source and channel layers as described include epitaxial layers. Thus, various materials can be selected for the source, channel and buffer layers as presented in Table 1 above. This enables, for example, source/channel hetero junction or hetero structure to be formed. This provides flexibility to select various suitable materials for the source and channel region for band gap engineering to reduce the tunneling barrier between the source and channel by means of band alignment. For example, various suitable materials can be chosen for the source and channel region so that the offset between the valence band (Ev) of the source and conduction band (Ec) in the channel is minimized. This allows for the improvement of SS and $I_{ON}$ of the FinFET. The channel region, as described, may also include multiple epitaxial layers satisfying these criteria. The channel layer may also include a multiple stacked epitaxial layer satisfying these criteria. Furthermore, the source and channel layers, for example, includes group III-V elements which create lattice mismatch which may induce the desired strain to enhance the carrier mobility in the channel. The buffer layer, as discussed, includes an intrinsically grown buffer layer. This reduces off leakage ($I_{OFF}$) caused by drain induced source tunneling.

Figure 2A:
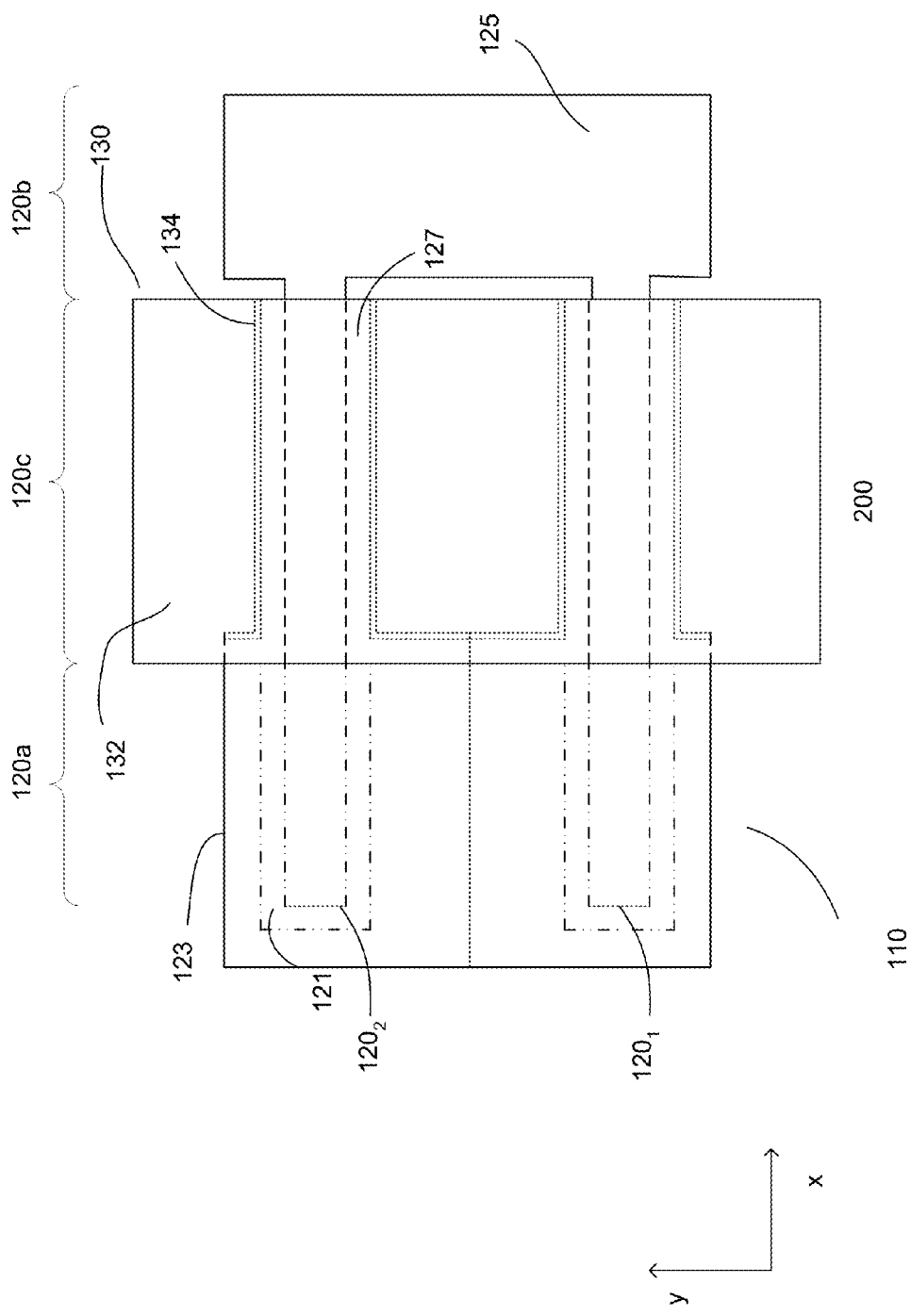
FIGS. 2a-b show top views of various embodiments of a device.

FIG. 2a shows top view of another embodiment of a device 200. The device is similar to that described in FIGS. 1a-d. As such, common elements may not be described or described in detail.

The device includes a fin-type transistor. Illustratively, the transistor includes a fin structure having first and second fins $120_1$ and $120_2$ defined in the first end and intermediate regions and a common fin defined in the second end region. Providing a transistor with other number of fins defined in the first end and intermediate regions may also be useful. For example, a transistor may include any number of fins. The fins are disposed on the substrate in parallel in a first direction. For example, the fins are disposed in parallel along the x direction. The fins are separated by space. The space between the fins, for example, may be about 20-60 nm wide. Providing spaces of other widths may also be useful, depending on the thickness of the source layer or $W_{fan}$.

A fin structure includes an intermediate region 120c between first and second end regions. The intermediate region serves as a gate region, the first end region 120a serves as a source region and the second end region 120b serves as a drain region. Buffer and source layers 121 and 123 are disposed on the fins in the source region. The source layer is heavily doped with first polarity type dopants, forming a source. A drain 125 is provided in the drain region of the fin. The drain, for example, is provided by heavily doping the drain region of the fin with second polarity type dopants. In one embodiment, separate fins are provided in the source region while a common fin is provided in the drain region. As a result of the growth and merging of the source layers on the first and second fins in the source region, a fin transistor having a common source and a common drain, as shown in FIG. 2a, is provided. Providing other configurations of source and drain may also be useful.

A gate channel layer 127 is provided in the intermediate region of the fin structure. A gate 130 is disposed on the substrate and traverses the intermediate regions of the fin structure in a second or y direction. The gate includes a gate dielectric layer 134 below a gate electrode layer 132. The gate serves as a common gate to the fins, producing a transistor with multiple gates.

Figure 2B:
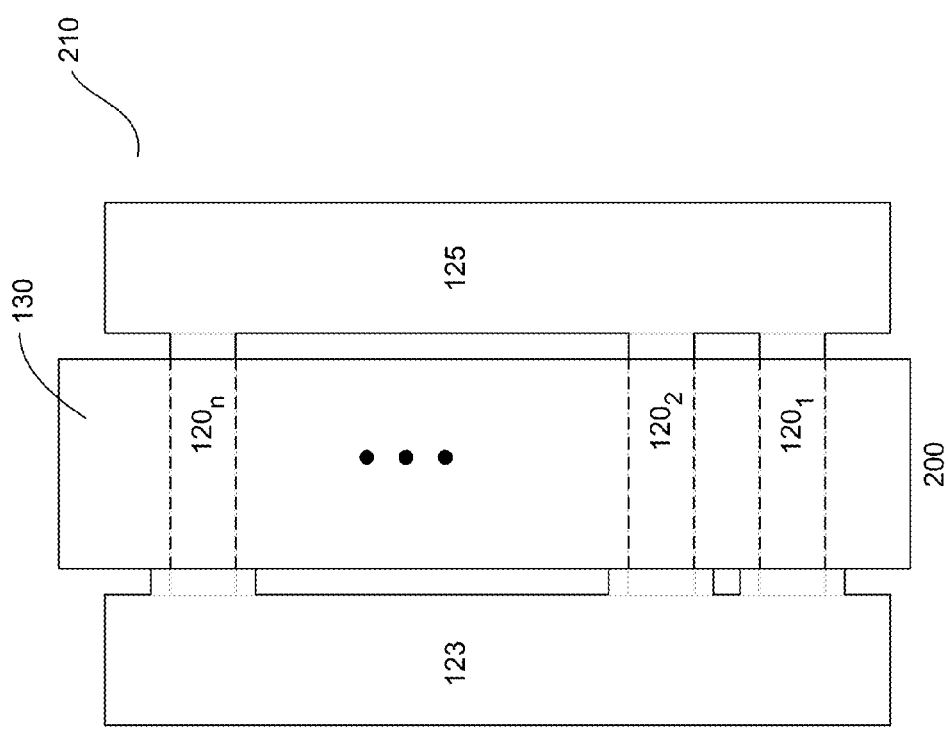

FIG. 2b shows a simplified top view of another embodiment of a device 200. The device is similar to that described in FIGS. 1a-d and 2a. As such, common elements may not be described or described in detail.

As shown, a multi-gate transistor 210 is provided. The multi-gate transistor includes a fin structure having n plurality of fins $120_1$-$120_n$ in the first end and the intermediate regions, where n is a whole number ≥2. The fins are disposed on the substrate along a first or x direction. In one embodiment, the fins have a common source 123 at a first end section 120a and a common drain 125 at a second end section 120b. Other configurations of sources and drains for the fins may also be useful. A gate 130 traverses the fins in a second or y direction. As shown, the gate is a common gate to the fins, providing a multi-gate transistor with n gates.

The fin transistor with multiple gates, as described in FIGS. 2a-b, may include some or all advantages as described with respect to FIGS. 1a-d. As such, these advantages will not be described or described in detail. Furthermore, it has been found that vertical tunneling fin type transistors of the present disclosure produce higher drive currents (e.g., $I_{ON}$) than conventional lateral tunneling transistors. By providing fin transistor having multiple gates, even higher drive currents can be achieved. The desired drive current can be achieved by selecting the appropriate number of fins. Furthermore, due to the high packing density of the fin type transistor, desired drive current can be achieved with a small footprint.

The drive current or $I_{ON}$ of a multi-gate vertical tunneling transistor, for example, can be approximated by the following equation:

$$I_{ON,DG} \sim (2 \times H_{fin}) \times n \times I_{ON}(W_{fan})$$

where
$I_{ON,DG}$=drive current;
$H_{fin}$=height of the fin structure;
n=number of fins; and
$W_{fan}$=width of the elevated or fan out source region.
The approximation is for an all-silicon based tunneling transistor and where the top of the fin structure is non-conducting.

As an example for purposes of illustration, assume that the multi-gate vertical tunneling transistor has the following parameters:
$H_{fin}$ is about 0.05 µm;
$W_{fan}$ is about 20 nm;
$W_{fin}$ is about 0.05 nm;
the space between fin s is about 0.05 µm; and
n is 10.
Based on the approximation above, the multi-gate vertical tunneling transistor would have, for example, an $I_{ON}$ of about 254 µA/µm. On the other hand, a lateral tunneling transistor with W=1 µm would have an $I_{ON}$, for example, of about 2.27 µA/µm. As such, the vertical tunneling transistor has an $I_{ON}$ of about 2 orders of magnitude higher than that of a lateral transistor occupying about the same area. The $I_{ON}$ may be further improved by, for example, using the materials in the respective layers as presented in Table 1.

FIGS. 3a-f show an embodiment of a process for forming a device 300. Figures with a subscript i are top views while those with a subscript ii are corresponding cross-sectional views taken along A-A'. The device formed is similar to that described in FIGS. 1a-c and 2a. As such, common elements may not be described or described in detail.

Referring to FIG. $3a_{i\text{-}ii}$, a substrate 101 is provided. The substrate, in one embodiment, includes a device region for a transistor. In one embodiment, the device region is for a fin type transistor, such as a vertical tunneling FinFET. It is understood that the device includes other regions for other types of circuit components.

In one embodiment, the substrate is a COI substrate. The COI substrate includes a dielectric layer 103 disposed between a bulk crystalline substrate (not shown) and surface crystalline layer 104. The COI substrate, for example, is a SOI substrate. Other types of COI substrates may also be useful. Other types of COI substrates, such as silicon-germanium (SiGe), germanium (Ge), gallium-arsenic (GaAs) or any other suitable semiconductor materials may also be useful. It is understood that the surface and bulk layers need not be the same material. Providing a bulk semiconductor substrate may also be useful. For example, the bulk substrate is a non-COI type of substrate. The bulk substrate may be a silicon substrate. Other types of semiconductor substrates may useful. The substrate may be an undoped or intrinsically doped substrate. The substrate may be a lightly doped substrate. In one embodiment, the substrate is lightly doped with p-type dopants. In the case of a COI substrate, at least the surface layer is lightly doped with p-type dopants. In other embodiments, the substrate may be lightly doped with other types of dopants, such as n-type dopants.

For illustration, the substrate is prepared with a fin structure having a shape which includes first and second fins $120_1$ and $120_2$ disposed on the dielectric layer 103 in the first end and intermediate regions and a common fin 120 in the second end region. Preparing the fin structure having other shapes with different number of fins, including a single fin or more than two fins in the first end and intermediate regions, may also be useful. In one embodiment, the fin structure is disposed on a BOX layer of a COI substrate. As shown, the fin structure is disposed along a first direction. The first direction is, for example, the x direction. The fin structure may include first and second contact pads (not shown) at first and second ends. The pads, for example, are wider than the fin to serve as contact regions.

Forming the fin structure may be achieved using a patterned hard mask 340. In one embodiment, a hard mask layer, such as silicon oxide or silicon nitride, is formed on the substrate. Other suitable types of materials may also be used as the hard mask layer. The hard mask layer may be formed by chemical vapor deposition (CVD). Other types of hard mask or techniques for forming the hard mask may also be useful.

The hard mask layer is patterned to correspond to the shape of the fin structure. The patterning of the hard mask layer can be achieved by mask and etch techniques. For example, a patterned soft mask (not shown), such as photoresist, may be used as an etch mask to pattern the hard mask layer. The soft mask may be patterned by photolithography. To improve lithographic resolution, an ARC (not shown) can be provided beneath the photoresist. The pattern of the photoresist mask is transferred to the hard mask by, for example, an anisotropic etch, such as a reactive ion etch (RIE). An anistropic etch, such as a RIE, is performed to remove portions of the surface substrate layer unprotected by the hard mask, leaving a fin structure as described above disposed on the BOX layer.

The fin structure includes an intermediate region 120c disposed between first and second end regions 120a-b. As discussed, first and second contact pads (not shown) may be included at first and second ends of the fin.

Referring to FIG. $3a_{i\text{-}ii}$, a dummy layer is formed on the substrate, covering the fin structure and dielectric layer. The dummy layer, for example, includes polysilicon, silicon nitride or silicon oxynitride. Various other materials and techniques may be employed to form the dummy layer. For example, the dummy layer should be of a material which can be removed or etched selectively to layers below, such as the fin and dielectric layer. The dummy layer may be formed by, for example, CVD. Other techniques, such as sputtering or spin coating may also be useful, depending on the material of the dummy layer.

The dummy layer is patterned to form a dummy gate 338. The dummy gate is disposed on the substrate, traversing the intermediate portion of the fin structure in the second direction. For example, the dummy gate traverses the fins in the y direction. In one embodiment, the second direction is orthogonal to the first direction. Providing a dummy gate which traverses the fins at other angles may also be useful. The dummy gate, for example, completely wraps around the fins. The patterning of the dummy layer can be achieved, for example, by mask and etch techniques. For example, a patterned soft mask, such as photoresist, may be used as an etch mask for an anisotropic etch, such as a reactive ion etch (RIE), to pattern the dummy layer. The etch may be selective to the dielectric layer and hard mask. In the case where no hard mask is present, the etch is selective to the dielectric layer and fin structure.

In the case where the hard mask is disposed on the surface of the fin, it is removed. For example, portions of the hard mask over the first and second end portions of the fin structure unprotected by the dummy gate are removed. Removal of the hard mask may be achieved using an isotropic etch, such as a wet etch. For example, a wet etch selective to the dielectric layer, fin structure and dummy gate is performed to remove exposed portions of the hard mask. Other suitable techniques of removing the exposed portions of the hard mask, such as RIE, may also be used.

As shown in FIG. $3b_{i\text{-}ii}$, a mask layer is formed over the substrate. The mask layer covers the dielectric layer, fin structure and dummy gate. The mask layer, for example, may be a photoresist layer. Other types of mask layers may also be useful. The mask layer is patterned to expose the second end portion of the fin structure. For example, the photoresist layer may be patterned by photolithographic techniques. The patterned mask layer 372 serves as a drain implant mask. The dummy gate can also serve as a mask, protecting the intermediate region of the fin structure. This allows a larger lithographic process window for the drain implant mask. For example, the drain implant mask may also expose a portion of the dummy gate.

An ion implantation process is performed to implant dopants into the second region of the fin structure, using the drain implant mask layer and dummy gate to protect the first end and intermediate regions of the fin structure from being implanted with dopants. In one embodiment, second polarity type dopants are implanted, forming the drain 125. The drain, in one embodiment, is a common drain heavily doped with second polarity type dopants. The second polarity type dopants, for example, are n-type dopants to form a n-type drain. After the drain is formed, the drain implant mask is removed. The mask can be removed by, for example, an ashing process. Other types of techniques may also be useful.

Referring to FIG. $3c_{i\text{-}ii}$, a second hard mask layer is formed on the substrate. The second hard mask layer covers the fin structure and the dummy gate. The second hard mask layer, for example, is formed of silicon oxide. The second hard mask layer may be formed by chemical vapor deposition (CVD). Other suitable types of hard mask or techniques for forming the hard mask may also be used. The thickness of the second hard mask layer, for example, may be about 30 nm. Other thicknesses and techniques may be employed to form the second hard mask layer.

The second hard mask layer is patterned to form a patterned second hard mask 344. Mask and etch techniques can be employed to form the second patterned hard mask. For example, a patterned soft mask 374 over the second hard mask layer is used as an etch mask for an anisotropic etch, such as a reactive ion etch (RIE), to pattern the second hard mask layer. The second hard mask layer, in one embodiment, is patterned to expose the first end region of the fin structure. The patterned second hard mask serves as a source processing mask. The dummy gate can also serve as a mask, protecting the intermediate region of the fin structure. This allows a larger lithographic process window. For example, the source processing mask may also expose a portion of the dummy gate. After patterning the second hard mask layer, the soft mask is removed.

In FIG. $3d_{i\text{-}ii}$, each of the first and second fins in the first end region of the fin structure is provided with a first semiconductor layer 121. The first semiconductor layer serves as a buffer layer, separating the fins from a subsequently formed source. In one embodiment, the buffer layer is formed by epitaxial growth. The epitaxial growth, in one embodiment, is selective epitaxial growth (SEG).

The buffer layer selectively forms on exposed semiconductor material. In one embodiment, the buffer layer selectively forms on exposed surfaces of the fins in the first end region. For example, the buffer layer forms on side and top surfaces of the fins in the first end region. A width or thickness of the buffer layer ($W_B$) can be precisely controlled using SEG. For example, the buffer layers are formed at a temperature of about 650 C and for duration of about 1 minute. The width or thickness of the buffer layer ($W_B$), for example, may be about 5-10 nm. For example, $W_B$ is about 5 nm. The thickness of the buffer layer may vary depending on, for example, the linewidth of the fins. Other suitable process parameters for forming the buffer layer may also be useful. For example, other process parameters may be used to form the buffer layer having a thickness being the same or thicker than the thickness of a gate channel layer so that the entire source tunneling junction is aligned to the gate. Alternatively, the buffer layer may be formed by other techniques. For example, the buffer layer may be formed by non-epitaxial techniques.

The process continues to form a second semiconductor layer on the buffer layer. The second semiconductor layer serves as a source layer 123. In one embodiment, the second semiconductor layer is formed by SEG. The SEG selectively forms the source layer on the buffer layer. For example, the source layer is disposed on side and top surfaces of the buffer layer. The width or thickness of the source layer ($W_{fan}$), for example, may be about 10-30 nm. Providing other $W_{fan}$ may also be useful. A width or thickness of the source layer ($W_{fan}$) can be precisely controlled using SEG. In one embodiment, the source layers on the first and second fins in the source region are grown using SEG and merged, forming a common source as shown in FIG. $3d_{i-ii}$. In one embodiment, $W_{fan}$ may vary or may be adjustable depending on the desired tunneling area which affects the drive current ($I_{ON}$) of the FinFET. Other techniques may also be used to form the source layer.

The source layer is doped with first polarity type dopants. The doped source layer forms a source of the transistor. For example, the source and drain are doped with opposite type dopants. In one embodiment, the source layer is heavily doped with first polarity type dopants. The dopant concentration of the source layer, for example, may be about $1e20\,cm^{-2}$. Other dopant concentrations may also be useful. In one embodiment, the first polarity type is p-type. P-type dopants, for example, may include B, Al, In or a combination thereof. Providing n-type as the first polarity type may also be useful. In one embodiment, the source layer is in situ doped. Doping the source layer by ion implantation may also be useful. In the case where the source layer is doped by ion implantation, an anneal, such as flash or laser anneal, is performed after the implant to activate the dopants in the source region.

The source and buffer layers may be formed from any element or combination of elements from group III-V of the periodic table. For example, the source and buffer layers may be Si, Ge, Ga-based, Al-based or alloys thereof. Other types of semiconductor materials may also be useful. It is understood that the source and buffer layers may be of the same or different types of semiconductor materials. Exemplary source and buffer layers are provided in Table 1.

The process continues by removing the second hard mask 344 over the portion of the dummy gate 338 and the drain region 125. The second hard mask can be removed by, for example, an isotropic etch process. The isotropic etch process, for example, includes a wet etch which removes the hard mask selective to the fin, source layer and dummy gate. Alternatively, the hard mask layer may be removed by an anisotropic etch, such as an RIE. Other types of techniques may also be useful. The removal of the second hard mask exposes the second end region of the fin structure or drain. As shown in FIG. $3e_{ii}$, the top surface of the source is elevated above the top surface of the drain.

Referring to FIG. $3e_{i-ii}$, an interlevel dielectric (ILD) layer 380 is deposited conformally over the substrate. The ILD, for example, may be formed of silicon oxide. Other types of dielectric material may also be useful. Preferably, the ILD is formed of a material which the dummy gate 338 and first patterned hard mask 340 under the dummy gate may be selectively removed to the ILD layer. The ILD may be formed by CVD. Other techniques for forming the ILD layer may also be useful. Excess dielectric material of the ILD layer is removed by a planarization process. In one embodiment, the excess material may be removed by CMP. Other types of planarization processes may also be useful. The CMP, for example, may use the dummy gate as a CMP stop. For example, the CMP forms a coplanar surface with the ILD and the dummy gate layers.

As shown in FIG. $3e_{i-ii}$, the process continues by removing the dummy gate 338. If the first patterned hard mask 340 is present under the gate, it is also removed along with the dummy gate. In one embodiment, the dummy gate and the first patterned hard mask may be removed using an etch process. The etch process, for example, includes an isotropic etch, such as a wet etch. The etch removes the dummy gate and first patterned hard mask selective to the ILD layer. Alternatively, the etch may be an anisotropic etch, such as a RIE. A dual etch process using different chemistries may also be employed to remove the dummy gate and the first patterned hard mask. Other techniques for removing the dummy gate and the hard mask layer may also be useful. The removal of the hard mask and the dummy gate forms a gate opening 339 which exposes the intermediate region of the fin structure and portions of the substrate which will be occupied by a gate of the transistor. For example, the gate opening traverses the intermediate region of the fin structure in the second or y direction and portions of the substrate adjacent to sides of the intermediate region of the fin structure. The removal of the hard mask and the dummy gate forms an opening which exposes sides of the source and buffer layers.

Referring to FIG. $3e_{i-ii}$, a third semiconductor layer 127 is formed on the substrate. The third semiconductor layer serves as a gate channel layer, separating the intermediate region the fin structure and a subsequently formed gate. In one embodiment, the gate channel layer is formed by epitaxial growth. The epitaxial growth, in one embodiment, is selective epitaxial growth (SEG). For example, the gate channel layer is formed at a temperature of about 700 C and for duration of about 20 sec. Other suitable process parameters may also be used. The gate channel layer selectively forms on exposed semiconductor material. In one embodiment, the gate channel layer selectively forms on exposed sides of the buffer and source layers and side and top surfaces of the first and second fins in the intermediate region of the fin structure. Other techniques for forming the gate channel layer may also be useful.

The gate channel layer may be formed from any element or combination of elements from group III-V of the periodic table. For example, the gate channel layer may be Si, Ge, Ga-based, Al-based or alloys thereof. Other types of semiconductor materials may also be useful. Exemplary gate channel layers are provided in Table 1.

The gate channel layer, illustratively, is an L-shaped gate channel layer. The gate channel layer has a thickness ($T_{CH}$). The thickness $T_{CH}$, for example, may be about 5-10 nm. For example, $T_{CH}$ is about 5 nm. Other thickness dimensions and other techniques may also be useful.

The process continues to form a gate. The gate includes a gate dielectric layer 334 and a gate electrode layer 332 over it as shown in FIG. $3f_{i-ii}$. In one embodiment, the gate is a HKMG. For example, the gate dielectric layer is a high k dielectric layer and the gate electrode is a metal gate layer. The high k gate dielectric layer, for example, may be silicon oxynitride, hafnium oxide, zirconium oxide or silicates thereof. Other types of high k dielectric materials may also be useful. The thickness of the gate dielectric layer may be about 2 nm. Other thicknesses may also be useful. As for the metal gate electrode, it may be W/TiNi, TaN, TiN, TaN/HfO$_2$ or Mo. Other types of gate electrode and gate dielectric materials may also be useful.

As shown, the gate dielectric and gate electrode layer are conformally formed on the substrate. For example, the gate dielectric layer lines the ILD and gate channel layer while the gate electrode layer covers the gate dielectric layer and fills the gate opening. The gate dielectric layer may be formed by, for example, atomic layer deposition technique while the gate electrode layer is formed by sputtering or CVD. The gate dielectric layer may also be formed, for example, by oxidation/nitridation process performed at a temperature below 600 C. Forming the gate dielectric and electrode layers by other techniques may also be useful.

Referring to FIG. 3$f_{i-ii}$, the substrate is planarized to remove excess gate electrode and gate dielectric material. For example, the planarization process removes excess material over the ILD layer. In one embodiment, the planarization process is CMP. Other types of planarization processes may also be useful. The CMP, for example, may use the ILD layer as a CMP stop. The planarization process forms a coplanar surface with the ILD, the gate dielectric and the gate electrode layers. The planarization process forms a gate 130 in the gate opening, traversing the intermediate region of the fin.

The process continues to form contacts to the terminals of the transistor. For example, as shown in FIG. 3$f_{i-ii}$, contacts 390 are formed in the ILD layer, coupling to the terminals, such as source and drain of the transistor. For example, the contacts coupled to the contact pads (not shown) on the fin and gate. The contacts, for example, are formed by etching contact openings into the ILD layer and filling with conductive material, such as W or Cu or its alloys. Other types of conductive materials may also be useful. Excess conductive material is removed by, for example, CMP to form the contacts.

To reduce contact resistance, metal silicide contacts 392 are formed on the terminals. To form the metal silicide contacts, a metal layer is blanket deposited into the contact openings. The metal layer, for example, may be nickel or an alloy thereof. For example, the metal layer includes Ni or NiPt. Other types of metal layers may also be useful. A low temperature anneal may be performed, for example, at a temperature of about 400 C, to cause a reaction between the metal and the source and drain, forming a silicide layer. Excess metal not reacted in the silicidation of the active surface is removed by, for example, a wet removal process. For example, unreacted metal material is removed selective to the silicide contacts. Other techniques for forming the silicide contacts may also be useful.

Additional process may be performed to complete the device. For example, interconnect metal levels may be provided to form interconnections to the terminals of the transistor and other circuit components, as desired. Other processes may include, for example, final passivation, dicing and packaging.

FIGS. 4$a$-$d$ show another embodiment of a process for forming a device 400. Figures with a subscript i are top views while those with a subscript ii are corresponding cross-sectional views taken along A-A'. The device formed is similar to that described in FIG. 1$d$ and FIGS. 3$a$-$f$. As such, common elements may not be described or described in detail.

Referring to FIG. 4$a_{i-ii}$, a substrate 101 is provided. The substrate is partially processed to the stage as described in FIG. 3$d_{i-ii}$. For example, a fin structure having first and second fins 120$_1$ and 120$_2$ in the first end and intermediate regions and a common fin in the second end region is disposed on the dielectric layer 103. The fins also include a buffer layer 121 and a source layer 123 in the first end region while the intermediate and second end regions 120$c$ and 120$b$ are protected by a second patterned hard mask 344 and a dummy gate 338.

The source and buffer layers may be formed from any element or combination of elements from group III-V of the periodic table. For example, the source and buffer layers may be Si, Ge, Ga-based, Al-based or alloys thereof. Other types of semiconductor materials may also be useful. It is understood that the source and buffer layers may be of the same or different types of semiconductor materials. Exemplary source and buffer layers are provided in Table 1.

In FIG. 4$a_{i-ii}$, the process continues by removing the second hard mask over the portion of the dummy gate and the drain region. The removal of the second hard mask exposes the second end region of the fin structure or drain. As shown, the top surface of the source is elevated above the top surface of the drain.

After removal of the second patterned hard mask, the dummy gate is removed. If the first patterned hard mask is present under the gate, it is also removed along with the dummy gate. This leaves with the buffer and source layers in the first end region exposed on the surface of the substrate.

Referring to FIG. 4$a_{i-ii}$, a third semiconductor layer 427 is formed on the substrate. The third semiconductor layer serves as a gate channel layer, separating the intermediate region of the fin structure and a subsequently formed gate. In one embodiment, the gate channel layer is formed by epitaxial growth. The epitaxial growth, in one embodiment, is selective epitaxial growth (SEG). For example, the gate channel layer is formed at a temperature of about 700 C and for duration of about 20 sec. Other suitable process parameters may also be used. The gate channel layer selectively forms on exposed semiconductor material. In one embodiment, the gate channel layer selectively forms on exposed surfaces of the buffer and source layers, the drain as well as the fins in the intermediate region. Other techniques for forming the gate channel layer may also be useful. The gate channel layer has a thickness (T$_{CH}$). The thickness T$_{CH}$, for example, may be about 5-10 nm. For example, T$_{CH}$ is about 5 nm. Other thickness dimensions and other techniques may also be useful.

The gate channel layer may be formed from any element or combination of elements from group III-V of the periodic table. For example, the gate channel layer may be Si, Ge, Ga-based, Al-based or alloys thereof. Other types of semiconductor materials may also be useful. Exemplary gate channel layers are provided in Table 1.

The process continues to form layers of a gate on the substrate. The layers of the gate are formed on the substrate, covering the dielectric layer and fin structure. The gate layers include a gate dielectric layer 434 and a gate electrode layer 432 over it. In one embodiment, the gate layers are layers of a HKMG. For example, the gate dielectric layer is a high k dielectric layer and the gate electrode is a metal gate layer. The high k gate dielectric layer, for example, may be silicon oxynitride, hafnium oxide, zirconium oxide or silicates thereof. Other types of high k dielectric materials may also be useful. The thickness of the gate dielectric layer may be about 2 nm. Other thicknesses may also be useful. As for the metal gate electrode, it may be W/TiNi, TaN, TiN, TaN/HfO$_2$ or Mo. Other types of gate electrode and gate dielectric materials may also be useful.

As shown, the gate dielectric and gate electrode layer are conformally formed on the substrate. For example, the gate layers cover the dielectric layer and fin. The gate dielectric layer may be formed by, for example, atomic layer deposition technique while the gate electrode layer is formed by sputtering or CVD. The gate dielectric layer may also be formed, for example, by oxidation or nitridation process performed at a temperature below 600 C. Forming the gate layers by other techniques may also be useful.

Referring to FIG. $4b_{i-ii}$, the gate layers are patterned to form a gate 130. The gate layers may be patterned using, for example, a soft mask, such as photoresist. The gate traverses the intermediate region of the fin structure. In one embodiment, the gate also traverses a portion of the source and drain. This is advantageous such that the tunneling area of the source can be increased.

After forming the gate, sidewall spacers 488 are formed on sidewalls of the gate, as shown in FIG. $4c_{i-ii}$. The gate sidewall spacers, for example, are formed of silicon nitride. Other types of spacer materials, such as silicon oxide or silicon oxynitride, may also be useful. To form the sidewall spacers, a spacer dielectric layer is deposited on the substrate. The spacers can be formed by using various techniques, such as plasma enhanced CVD (PECVD). Other techniques to form the spacer dielectric layer or forming other types of spacers may also be useful. The spacer dielectric layer is subsequently anisotropically etched, such as by RIE, to remove horizontal portions, leaving non-horizontal portions on the sidewalls of the gate as spacers.

Metal silicide contacts 392 may be formed on the source and drain. To form the silicide contacts, a metal layer is deposited over the substrate, covering the fin structure, gate and dielectric layer. Preferably, the metal layer includes nickel or an alloy thereof, such as Ni or NiPt. Other types of metal layers may also be useful. A salicide process is performed to form metal silicide contacts 392 over semiconductor material. The salicide process, for example, includes annealing the substrate, causing a reaction between the metal and semiconductor material. Unreacted or excess metal are then removed, for example, by wet cleaning, similar to that as described in FIG. 3f.

Referring to FIG. $4d_{i-ii}$, an interlevel dielectric (ILD) layer 380 is formed over the substrate. In one embodiment, the ILD layer is deposited conformally over the substrate. The ILD, for example, may be formed by CVD. Other techniques for forming the ILD layer may also be useful. Excess dielectric material of the ILD layer is removed by a planarization process. In one embodiment, the excess material may be removed by CMP. Other types of planarization processes may also be useful. The CMP, for example, may use the gate layer as a CMP stop. For example, the CMP forms a coplanar surface with the ILD and the gate layer.

The process continues to form contacts 390 to the terminals of the transistor as well other processes for completing the device, as described in FIG. 3f and onwards.

FIGS. 5a-b show another embodiment of a process for forming a device 500. Figures with a subscript i are top views while those with a subscript ii are corresponding cross-sectional views taken along A-A'. The device formed is similar to that described in FIG. 1e, FIGS. 3a-f and FIGS. 4a-d. As such, common elements may not be described or described in detail.

For illustration, the substrate is prepared with a fin structure having a shape of which first and second fins are defined in the intermediate region and a common fin is defined in the first and second end regions as shown in FIG. $5a_{i-ii}$. Preparing the substrate having other configurations of fin structure may also be useful. In one embodiment, the fin structure is disposed on a BOX layer of a COI substrate. As shown, the fin structure is disposed along a first direction. The first direction is, for example, the x direction.

Forming the fin structure may be achieved using a patterned hard mask 540. In one embodiment, a hard mask layer, such as silicon oxide or silicon nitride, is formed on the substrate. Other suitable types of materials may also be used as the hard mask layer. The hard mask layer may be formed by chemical vapor deposition (CVD). Other types of hard mask or techniques for forming the hard mask may also be useful. The hard mask layer is patterned to correspond to the shape of the fin structure. The patterning of the hard mask layer can be achieved by mask and etch techniques. Other suitable types of techniques may also be used to pattern the hard mask layer.

The process continues to form nanowires $520_1$ and $520_2$ as shown in FIG. $5a_{i-ii}$. The nanowires are formed by, for example, oxidizing the fin structure which results in anisotropic oxidation at the edge and center of the fin structure. A wet etch using DHF (1:50), for example, is performed to remove the oxidized regions of the fin, leaving behind a pair of vertically stacked nanowires as shown in FIG. $5a_{i-ii}$. Other suitable techniques for forming the nanowires may also be useful.

The nanowire, for example, may have circular cross-sectional shape. Providing nanowire with other types of cross-sectional shapes, such as rectangular, square, elliptical or trapezoidal, may also be useful. The use of nanowire, such as vertically stacked nanowire, is advantageous as it increases the packing density and tunneling area.

Referring to FIG. $5b_{i-ii}$, a dummy layer is formed on the substrate, covering the fin structure and dielectric layer. The dummy layer, for example, includes polysilicon, silicon nitride or silicon oxynitride. Various other materials and techniques may be employed to form the dummy layer. For example, the dummy layer should be of a material which can be removed or etched selectively to layers below, such as the fin and dielectric layer. The dummy layer may be formed by, for example, CVD. Other techniques, such as sputtering or spin coating may also be useful, depending on the material of the dummy layer.

The dummy layer is patterned to form a dummy gate 338. The dummy gate is disposed on the substrate, traversing the intermediate region of the fin structure in the second direction. For example, the dummy gate traverses the fins in the y direction. In one embodiment, the second direction is orthogonal to the first direction. Providing a dummy gate which traverses the fins at other angles may also be useful. The dummy gate, for example, completely wraps around the fins. The patterning of the dummy layer can be achieved, for example, by mask and etch techniques. For example, a patterned soft mask, such as photoresist, may be used as an etch mask for an anisotropic etch, such as a reactive ion etch (RIE), to pattern the dummy layer. The etch may be selective to the dielectric layer and hard mask. In the case where no hard mask is present, the etch is selective to the dielectric layer and fin structure.

The process continues to complete the device, as described in FIGS. 3b-3f or from FIGS. 3b-3d to FIGS. 4a-d.

The embodiments as described with respect to FIGS. 3a-f, FIGS. 4a-d and FIGS. 5a-b include some or all advantages as described with respect to FIGS. 1a-e and FIGS. 2a-b. As such, these advantages will not be described or described in detail.

Figure 6:
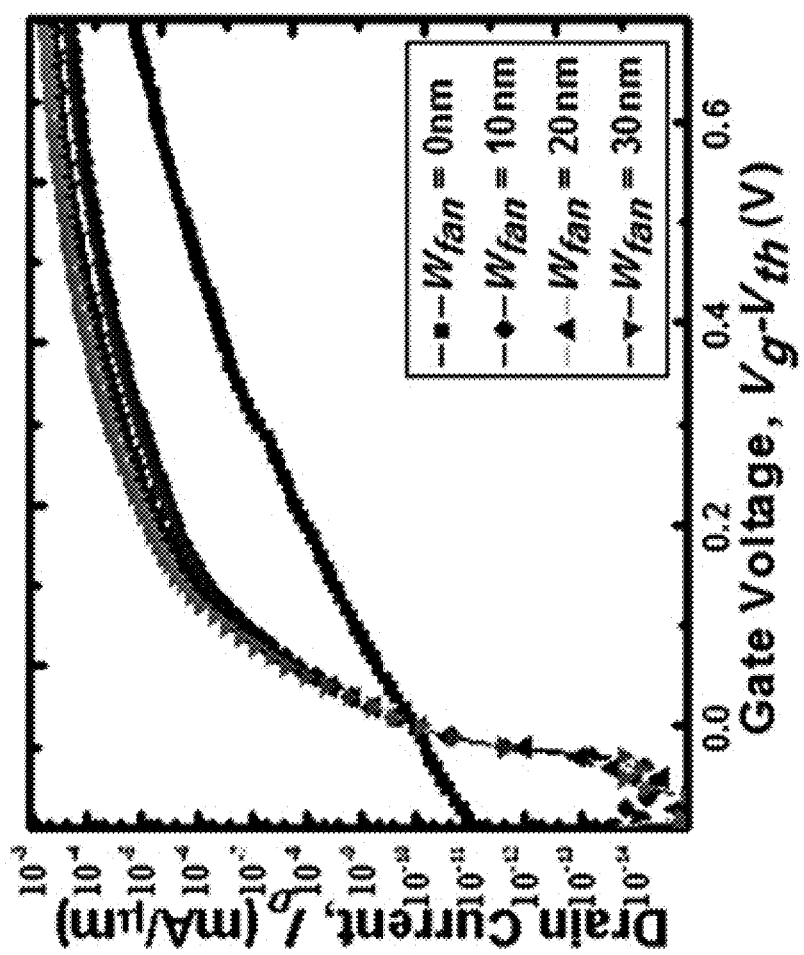
FIG. 6 shows gate transfer characteristics of vertical tunneling FinFET.
Figure 7:
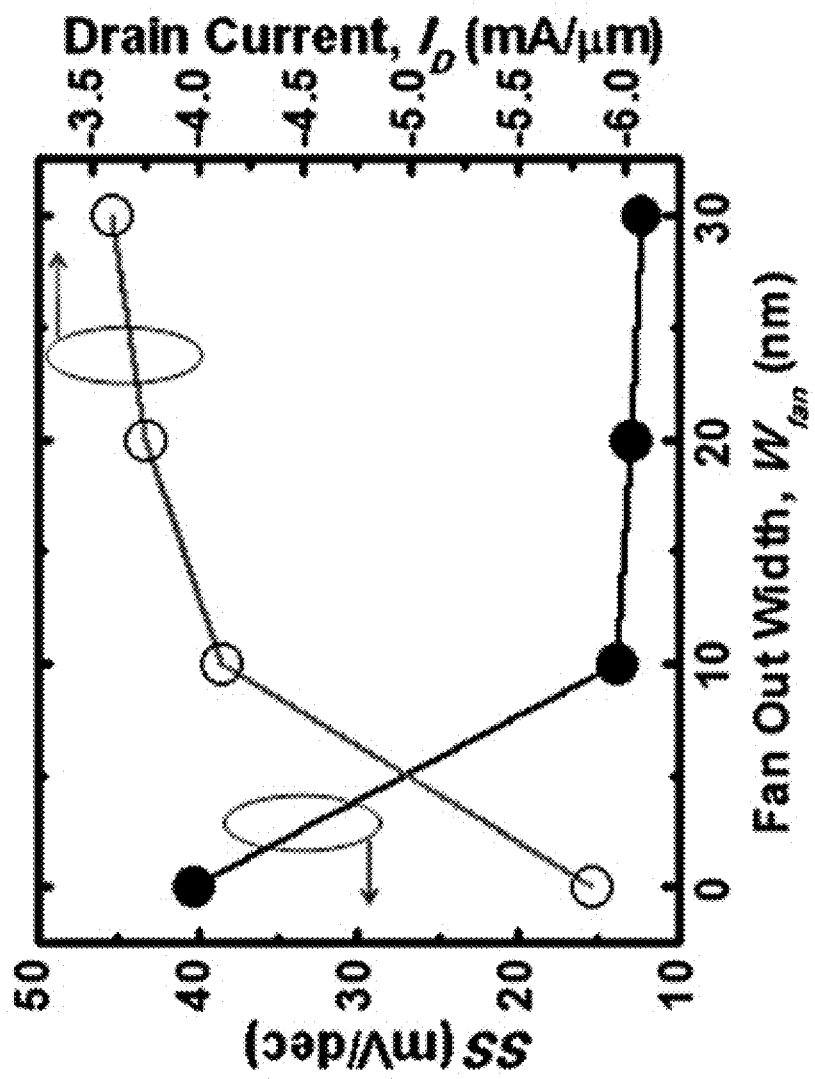
FIG. 7 shows the effect of $W_{fan}$ scaling on $I_{ON}$ and SS.

A 2-D TCAD simulation is carried out to illustrate the effect of $W_{fan}$ scaling on the performance of a vertical tunneling FinFET. FIG. 6 shows gate transfer characteristics of vertical tunneling FinFET while FIG. 7 shows the effect of $W_{fan}$ scaling on $I_{ON}$ and SS. FIGS. 6 and 7, clearly show an improvement of SS and $I_{ON}$ of vertical FinFET relative to a conventional TFET ($W_{fan}$=0 nm). As shown, $I_{ON}$ of vertical tunneling FinFET can be scaled almost linearly by varying $W_{fan}$.

Figure 8:
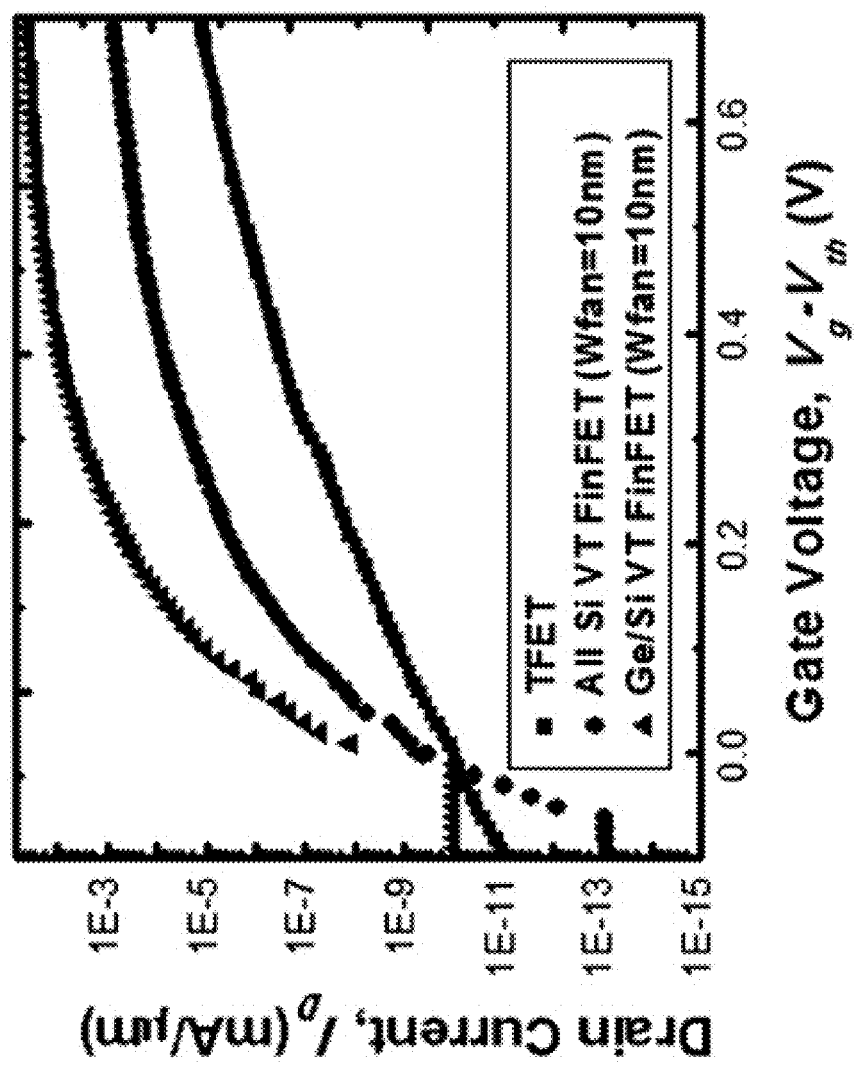
FIG. 8 shows $I_{ON}$ for a band gap engineered Ge/Si hetero junction as compared to an all-Si structure and conventional tunneling FinFET.

As described, the SEG channel provides the flexibility to grow various materials for band gap engineering to reduce the tunneling barrier between the source and channel by means of band alignments and stress engineering. FIG. 8 shows $I_{ON}$ for a band gap engineered Ge/Si hetero junction based on the embodiments as described as compared to an all-Si structure and conventional tunneling FinFET. Clearly, FIG. 8 shows that the $I_{ON}$ for a band gap engineered Ge/Si hetero junction is enhanced. For example, the $I_{ON}$ for a band gap engineered Ge/Si hetero junction is enhanced by more than 1 order of magnitude relative to the other types of FinFET.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a substrate; and
   a fin-type transistor disposed on the substrate, wherein the transistor comprises a fin structure which serves as a body of the transistor, wherein the fin structure includes first and second end regions and an intermediate region in between the first and second end regions of the fin structure,
   a source region disposed on the first end region, a drain region disposed in the second end region and a gate disposed on the intermediate region of the fin structure,
   a fin buffer layer disposed in the source region of the fin structure and a source layer over the fin buffer layer, and
   a channel region disposed adjacent to the source region and a gate dielectric of the gate, wherein a source tunneling junction is aligned to the gate with a controlled channel thickness $T_{CH}$.

2. The device of claim 1 wherein the fin buffer layer is a conformal fin buffer layer and the source layer is a conformal source layer over the fin buffer layer.

3. The device of claim 2 wherein the fin buffer and the source layers are epitaxial crystalline semiconductor layers.

4. The device of claim 3 wherein a top surface of the source region is elevated above a top surface of the drain region.

5. The device of claim 1 wherein the channel region includes a channel layer having an epitaxial crystalline semiconductor layer.

6. A method for forming a device comprising:
   providing a substrate; and
   forming a fin-type transistor on the substrate, wherein forming the transistor comprises
      forming a fin structure having a shape, wherein the fin structure includes first and second end regions and an intermediate region in between the first and second end regions of the fin structure and the fin structure serves as a body of the transistor,
      forming a source region on the first end region, a drain region in the second end region and a gate on the intermediate region of the fin structure,
      forming a fin buffer layer in the source region over the fin structure and a source layer over the fin buffer layer, and
      forming a channel region adjacent to the source region and a gate dielectric of the gate, wherein a source tunneling junction is aligned to the gate with a controlled channel thickness $T_{CH}$.

7. The method of claim 6 wherein the shape of the fin structure comprises first and second fins defined in the first end and intermediate regions and a common fin defined in the second end region of the fin structure.

8. The method of claim 7 wherein forming the fin structure comprises:
   providing a first hard mask layer over a top surface of the substrate; and
   patterning the first hard mask layer to correspond to the shape of the fin structure.

9. The method of claim 8 further comprises:
   forming a dummy gate on the substrate, wherein the dummy gate traverses the intermediate region of the fin structure; and
   removing portions of the first patterned hard mask which are unprotected by the dummy gate.

10. The method of claim 9 wherein forming the drain region comprises:
    providing a patterned mask layer which covers the substrate, the first end region of the fin structure and the dummy gate while exposing the second end region of the fin structure; and
    implanting second polarity type dopants into the second end region of the fin structure.

11. The method of claim 9 wherein forming the source region comprises:
    providing a second patterned hard mask which covers the drain region and the dummy gate while exposing the first and second fins in the first end region;
    forming a first semiconductor layer which serves as the buffer layer over each of the fins; and
    forming a second semiconductor layer which serves as the source layer over the buffer layers.

12. The method of claim 11 wherein the first and second semiconductor layers are formed by selective epitaxial growth.

13. The method of claim 11 further comprises:
    implanting first polarity type dopants into the source layer; and
    removing the second patterned hard mask.

14. The method of claim 13 further comprises:
    providing an interlevel dielectric layer over the substrate; and
    removing the dummy gate and the first patterned hard mask under the dummy gate, wherein removal of the dummy gate and the first patterned hard mask forms an opening which exposes sides of the source and buffer layers and the intermediate region of the fin structure.

15. The method of claim 14 wherein forming the channel region comprises forming a third semiconductor layer which serves as a channel layer on exposed sides of the source and buffer layers and the intermediate region of the fin structure.

16. The method of claim 15 wherein the third semiconductor layer is formed by selective epitaxial growth.

17. The method of claim 13 further comprises:
    removing the dummy gate and the first patterned hard mask under the dummy gate, wherein removal of the dummy gate and the first patterned hard mask exposes sides of the source and buffer layers and the intermediate and drain regions of the fin structure.

18. The method of claim 17 wherein forming the channel region comprises forming a third semiconductor layer which serves as a channel layer on exposed sides of the source and buffer layers and the intermediate and drain regions of the fin structure.

19. The method of claim 18 wherein the third semiconductor layer is formed by selective epitaxial growth.

20. The method of claim 6 further comprises forming sidewall spacers on sidewalls of the gate.

\* \* \* \* \*